United States Patent
Wang

(10) Patent No.: US 12,356,637 B2
(45) Date of Patent: Jul. 8, 2025

(54) METHOD FOR FORMING SEMICONDUCTOR STRUCTURE AND SEMICONDUCTOR STRUCTURE

(71) Applicant: CHANGXIN MEMORY TECHNOLOGIES, INC., Anhui (CN)

(72) Inventor: Lingxiang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 855 days.

(21) Appl. No.: 17/411,108

(22) Filed: Aug. 25, 2021

(65) Prior Publication Data

US 2022/0052151 A1 Feb. 17, 2022

Related U.S. Application Data

(63) Continuation of application No. PCT/CN2021/098929, filed on Jun. 8, 2021.

(30) Foreign Application Priority Data

Aug. 13, 2020 (CN) .......................... 202010814732.X

(51) Int. Cl.
   *H10B 12/00* (2023.01)
   *H10D 1/00* (2025.01)
   *H10D 1/68* (2025.01)

(52) U.S. Cl.
   CPC ......... *H10D 1/043* (2025.01); *H10B 12/0335* (2023.02); *H10B 12/31* (2023.02); *H10D 1/696* (2025.01); *H10D 1/716* (2025.01)

(58) Field of Classification Search
   CPC ......... H01L 28/92; H01L 28/75; H01L 28/90; H10B 12/0335; H10B 12/31; H10B 12/033
   See application file for complete search history.

(56) References Cited

U.S. PATENT DOCUMENTS 6,559,495 B1 * 5/2003 Abiko .................. H10B 12/033
                                                    257/306
6,974,985 B2    12/2005 Kurasawa
                (Continued)

FOREIGN PATENT DOCUMENTS

CN         205956089 U       2/2017
CN         107301976 B       5/2018
                (Continued)

*Primary Examiner* — Kyoung Lee
*Assistant Examiner* — Sophia W Kao
(74) *Attorney, Agent, or Firm* — Syncoda LLC; Feng Ma

(57) ABSTRACT

A method for forming semiconductor structure includes: providing a semiconductor substrate, which at least includes discrete conducting layers in the semiconductor substrate; forming discretely arranged supporting structures on the semiconductor substrate, lower portions of the supporting structures including a bottom conducting layers, and capacitor openings being included between the supporting structures, and the bottom conducting layers being electrically connected with the conducting layers; forming lower electrodes on sidewalls of the supporting structures, the lower electrodes being electrically connected with the bottom conducting layers; forming a capacitor dielectric layer covering tops of the supporting structures, sidewalls of the lower electrodes, and bottoms of the capacitor openings; and forming an upper electrode covering the capacitor dielectric layer), to form a capacitor structure. A semiconductor structure is also provided.

16 Claims, 30 Drawing Sheets

(56) References Cited

U.S. PATENT DOCUMENTS

| | | | |
|---|---|---|---|
| 9,362,422 B2 * | 6/2016 | Lim | H10B 12/30 |
| 9,859,296 B2 * | 1/2018 | Park | H10B 43/35 |
| 10,784,334 B2 * | 9/2020 | Chang | H01L 28/88 |
| 10,886,276 B2 * | 1/2021 | Hwang | H10B 12/31 |
| 11,387,384 B2 * | 7/2022 | Park | H01L 33/24 |
| 2002/0102791 A1 * | 8/2002 | Kurasawa | H01L 28/55 |
| | | | 257/E21.019 |
| 2003/0127679 A1 | 7/2003 | Abiko | |
| 2015/0171159 A1 * | 6/2015 | Lim | H10B 12/0335 |
| | | | 257/532 |
| 2017/0069636 A1 * | 3/2017 | Park | H10B 43/27 |
| 2017/0084613 A1 | 3/2017 | Hwang | |
| 2019/0123135 A1 | 4/2019 | Chang et al. | |

FOREIGN PATENT DOCUMENTS

| | | |
|---|---|---|
| CN | 208189581 U | 12/2018 |
| CN | 109148427 A | 1/2019 |
| CN | 109698274 A | 4/2019 |
| CN | 110970401 A | 4/2020 |

\* cited by examiner

METHOD FOR FORMING SEMICONDUCTOR STRUCTURE AND SEMICONDUCTOR STRUCTURE

CROSS-REFERENCE TO RELATED APPLICATIONS

This application is a continuation application of International Application No. PCT/CN2021/098929, filed on Jun. 8, 2021, which claims priority to Chinese Patent Application No. 202010814732.X, filed on Aug. 13, 2020. International Application No. PCT/CN2021/098929 and Chinese Patent Application No. 202010814732.X are hereby incorporated by reference in their entireties.

BACKGROUND

With the constant reduction of feature sizes of Dynamic Random Access Memories (DRAMs), sizes of formed capacitors are also constantly reduced, and high-aspect-ratio capacitors are required to be formed to ensure capacitor of the capacitors. At present, capacitor of capacitors is increased mainly by forming double-sided capacitors. In a process of forming a high-aspect-ratio double-sided capacitor, a capacitor hole with high-aspect-ratio is required to be formed by etching to form a hollow capacitor column.

However, the applicant finds that in a process of forming a double-sided capacitor, if an aspect ratio of the formed double-sided capacitor is relatively high, when a hollow capacitor column is formed by etching, a capacitor structure is instable and likely to collapse, and inner-sided capacitor of the double-sided capacitor is electrically instable, so the yield of a semiconductor structure is affected.

SUMMARY

The disclosure relates to the field of semiconductors, and particularly to a method for forming semiconductor structure and a semiconductor structure.

Embodiments of the disclosure provide a method for forming semiconductor structure, which include providing a semiconductor substrate, which at least comprises discrete conducting layers in the semiconductor substrate; forming discretely arranged supporting structures on the semiconductor substrate, in which lower portions of the supporting structures comprise bottom conducting layers, and capacitor openings are comprised between the supporting structures, and the bottom conducting layers being electrically connected with the conducting layers; forming lower electrodes on sidewalls of the supporting structures, in which the lower electrodes are electrically connected with the bottom conducting layers; forming a capacitor dielectric layer covering tops of the supporting structures, sidewalls of the lower electrodes, and bottoms of the capacitor openings; and forming an upper electrode covering the capacitor dielectric layer, to form a capacitor structure.

Embodiments of the disclosure also provide a semiconductor structure, which includes: a semiconductor substrate, which at least discrete conducting layers is included in the semiconductor substrate; multiple discrete supporting structures located on the semiconductor substrate, in which a lower portion of a supporting structure at least comprises a bottom conducting layer, and the bottom conducting layer is electrically connected with the conducting layer; and capacitor structures supported by the supporting structures. A capacitor structure includes: a lower electrode located on a sidewall of the supporting structure and electrically connected with the bottom conducting layer; a capacitor dielectric layer located on a top of the supporting structure, a sidewall of the lower electrode, and a bottom of a gap between the supporting structures; and an upper electrode located on the capacitor dielectric layer.

DETAILED DESCRIPTION

At present, in a process of forming a double-sided capacitor, if an aspect ratio of the formed double-sided capacitor is relatively high, when a hollow capacitor column is formed by etching, a capacitor structure is instable and likely to collapse, and inner-sided capacitor of the double-sided capacitor is electrically instable, so the yield of a semiconductor structure is affected.

In order to solve the foregoing problem, an embodiment of the disclosure provides a method for forming semiconductor structure, which includes the following operations. A semiconductor substrate is provided, which at least comprises discrete conducting layers in the semiconductor substrate. Discretely arranged supporting structures are formed on the semiconductor substrate, in which capacitor openings are included between the supporting structures. Lower electrodes are formed on sidewalls of the supporting structures, which are electrically connected with the conducting layers. A capacitor dielectric layer covering tops of the supporting structures, the sidewalls of the lower electrodes, and bottoms of the capacitor openings is formed. An upper electrode covering the capacitor dielectric layer is formed, to constitute a capacitor structure.

In order to make the objectives, technical solutions, and advantages of the embodiments of the disclosure clearer, each embodiment of the disclosure will be described below in detail in combination with the drawings. However, those of ordinary skill in the art can understand that, in each embodiment of the disclosure, many technical details are proposed to make readers understand the disclosure better. However, the technical solutions claimed by the disclosure may also be implemented even without these technical details and various variations and modifications made based on each of the following embodiments. Division of each of the following embodiments is for ease of description and should not form any limit to specific implementation modes of the disclosure. Embodiment can be combined and refer to each other without conflicts.

FIG. 1 to FIG. 18 show the flowchart corresponding to each step of the method for forming semiconductor structure according to the embodiment. The method for forming semiconductor structure of the embodiment will be specifically described below. It is to be noted that specific introductions are made in the embodiment taking a semiconductor structure in a memory as an example. That is, in the embodiment, a semiconductor structure to be protected is formed in a DRAM or a static random access memory (SRAM).

Figure 1:
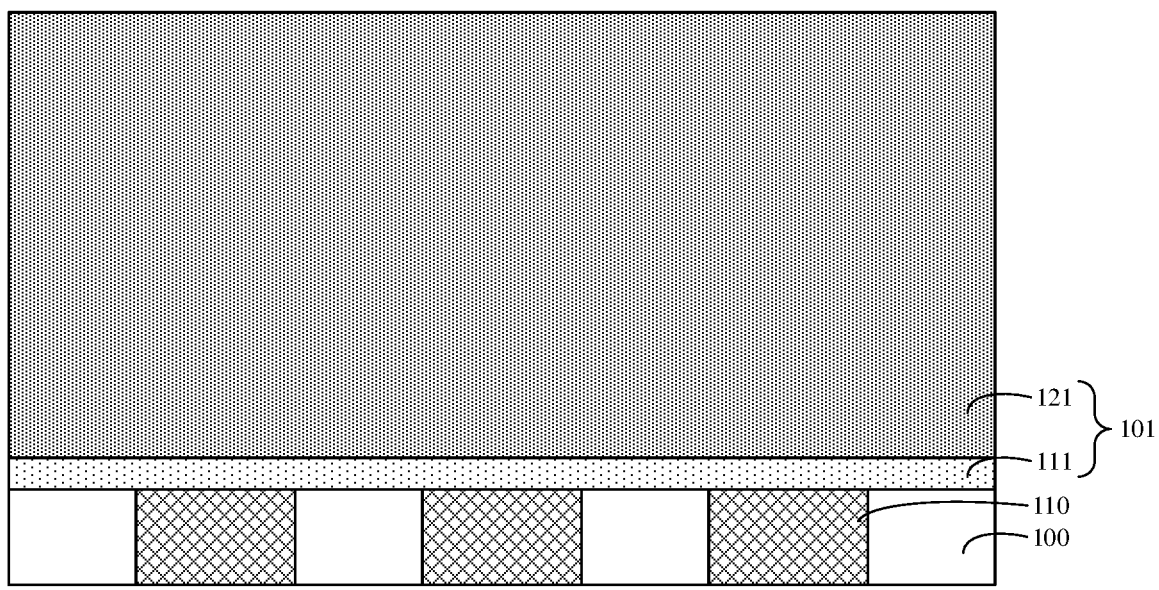
FIG. 1 to FIG. 18 are sectional structure diagrams of a semiconductor structure corresponding to each step of a method for forming semiconductor structure according to an embodiment of the disclosure.
Figure 8:
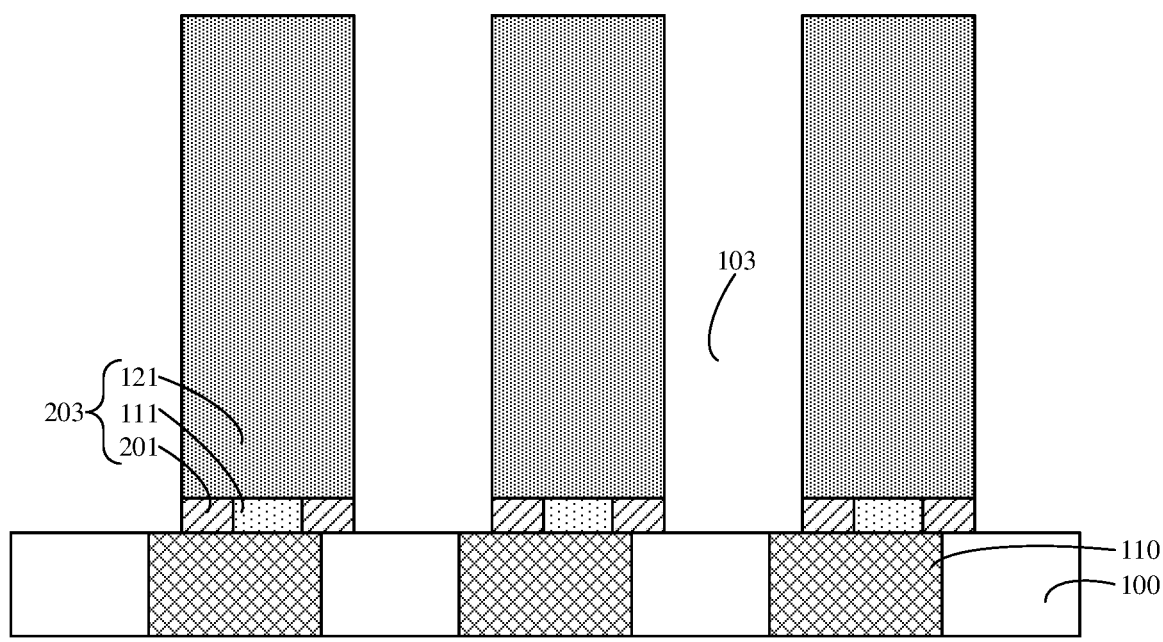
Figure 9:
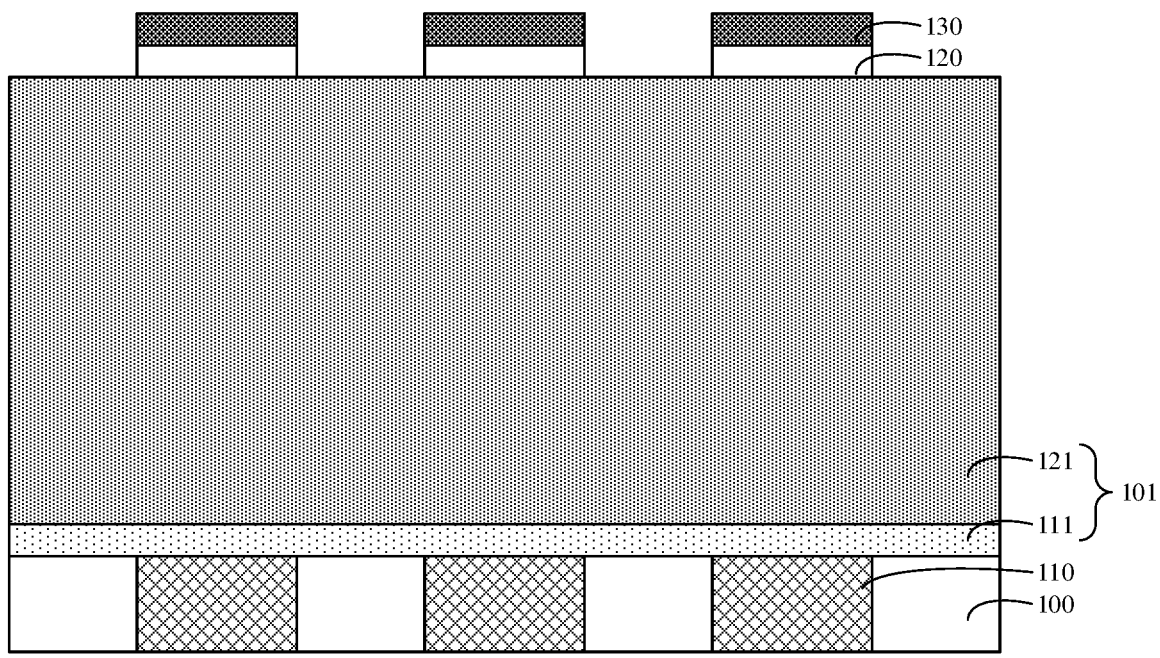
Figure 10:
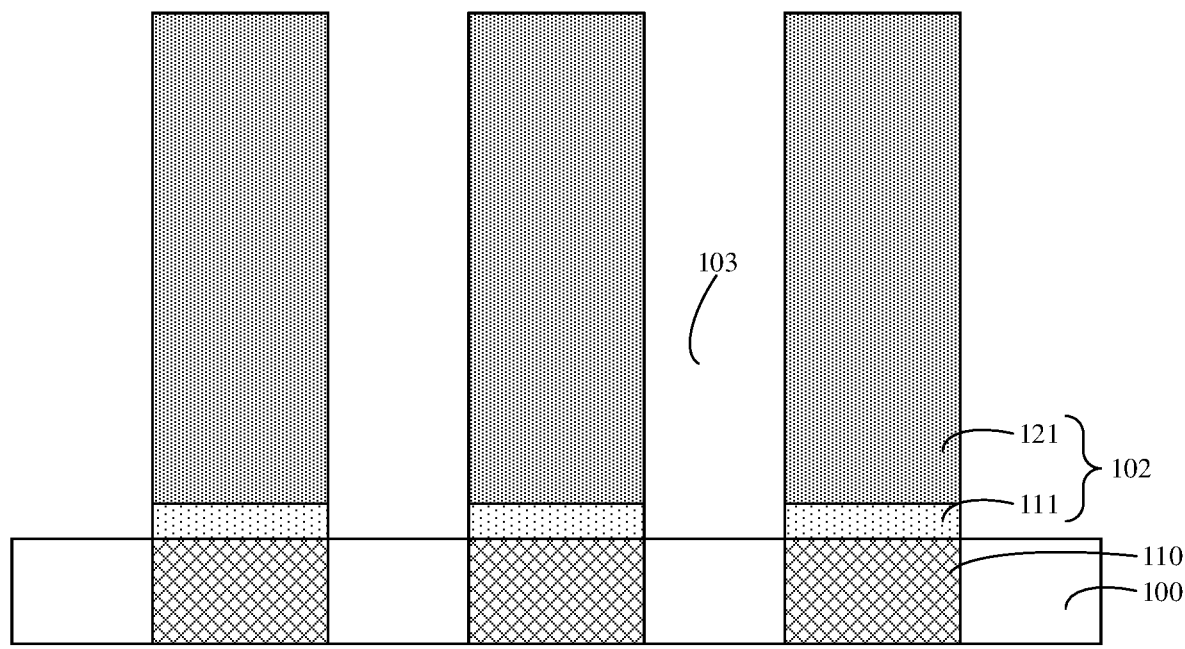
Figure 11:
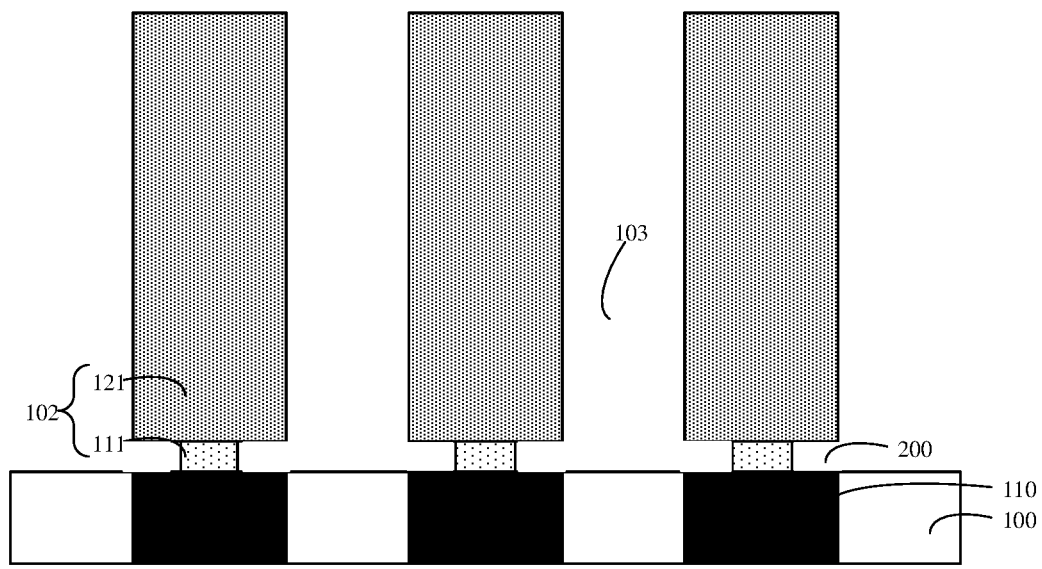
Figure 12:
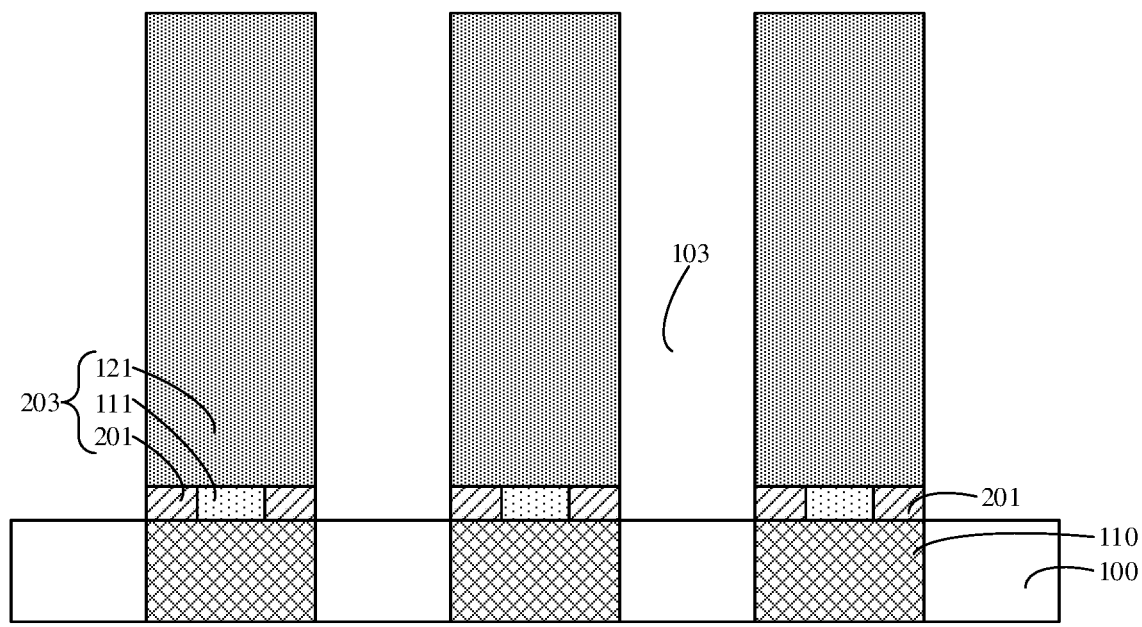

Referring to FIG. 1 and FIG. 8, a semiconductor substrate 100 is provided, and discretely arranged supporting structures 203 are formed on the semiconductor substrate 100. There is included a bottom conducting layer 201 in a lower portion of the supporting structure 203. There is included a capacitor opening 103 between the supporting structures 203. The bottom conducting layers 201 is electrically connected with a conducting layer 110.

Referring to FIG. 1, there are at least included discrete conducting layers 110 in the semiconductor substrate 100.

Figure 2:
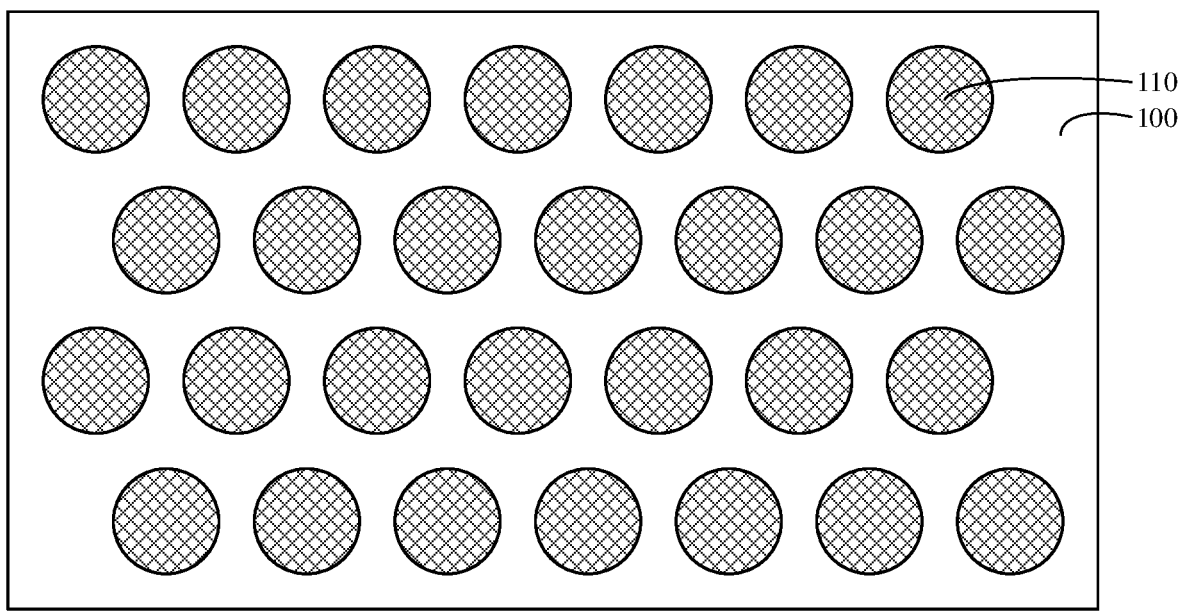

An arrangement of the discrete conducting layers 110 in the semiconductor substrate 100 is shown in FIG. 2. The conducting layer 110 is a landing pad in a DRAM structure. The conducting layers 110 are hexagonally arranged and configured to electrically connect array transistors of the DRAM.

Referring back to FIG. 1, an initial supporting layer 101 is formed on the semiconductor substrate 100. The initial supporting layer 101 is configured to subsequently form initial supporting structures 102 by etching.

The initial supporting layer 101 includes a bottom supporting layer 111 and filling layer 121 that are formed by sequential stacking. Due to the process of sequentially stacking of the initial supporting layer 101, formation of an initial supporting layer 101 with a relatively great thickness by a single deposition is avoided, and higher compactness of the formed initial supporting layer 101 is ensured. The initial supporting layer 101 is formed by sequential stacking, so that it is ensured that the initial supporting structure 102 that is subsequently formed is relatively high, and an aspect ratio of a subsequently formed columnar capacitor is increased. In the embodiment, the bottom supporting layer 111 and the filling layer 121 are formed from different insulating materials.

It is to be noted that, in another embodiment, the initial supporting layer may also be implemented by a stacked structure of three or more layers, and the stacked structure implemented in such a manner is higher, namely the subsequently formed supporting structure is higher.

Referring to FIG. 3 to FIG. 6, the initial supporting layer 101 is patterned to form the capacitor openings 103, and the remaining initial supporting layer 101 forms initial supporting structures 102.

Figure 3:
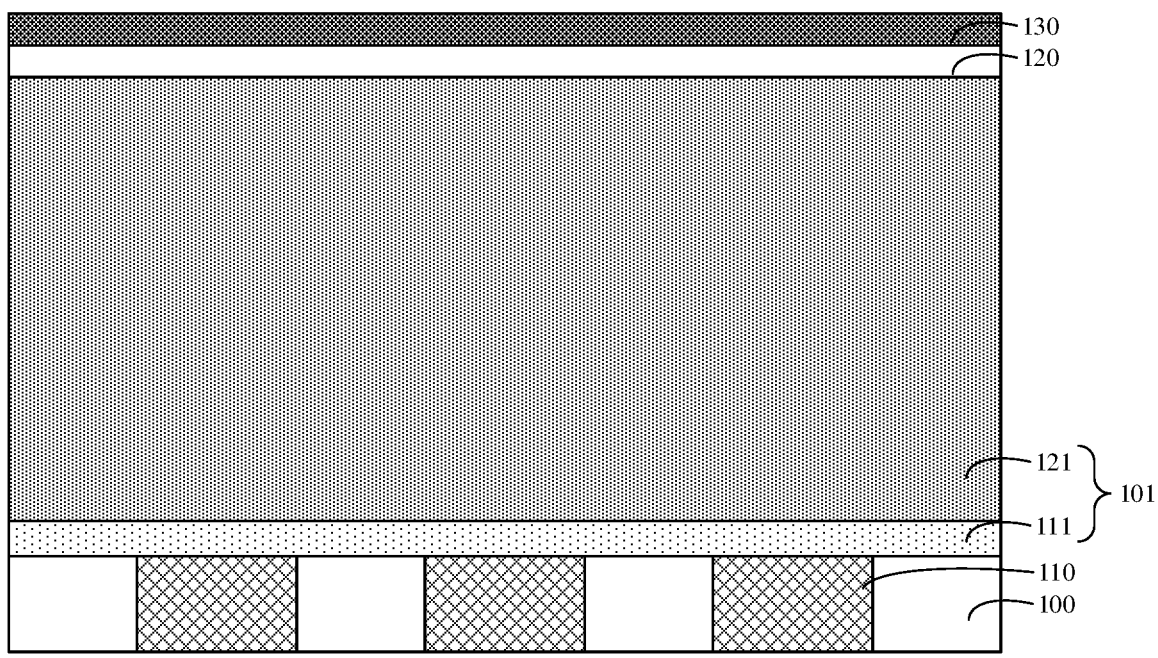

Referring to FIG. 3, a mask layer 120 and a patterned photoresist layer 130 are sequentially formed on the initial supporting layer 101.

Figure 4:
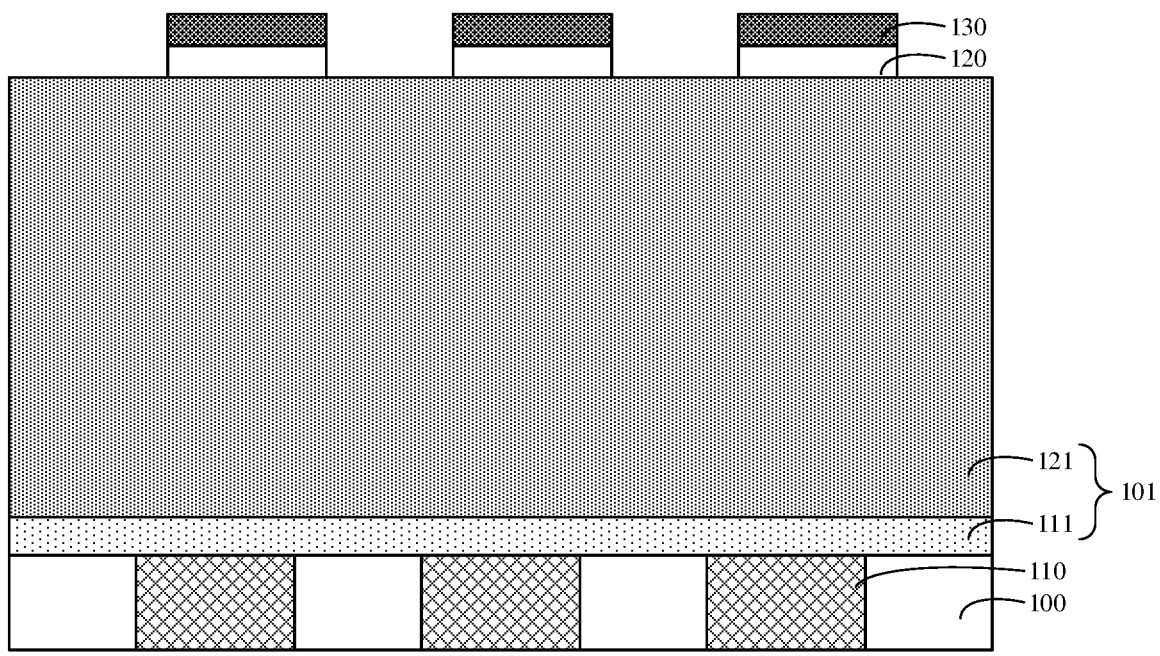

Referring to FIG. 4, the mask layer 120 is patterned based on the photoresist layer 130.

Figure 5:
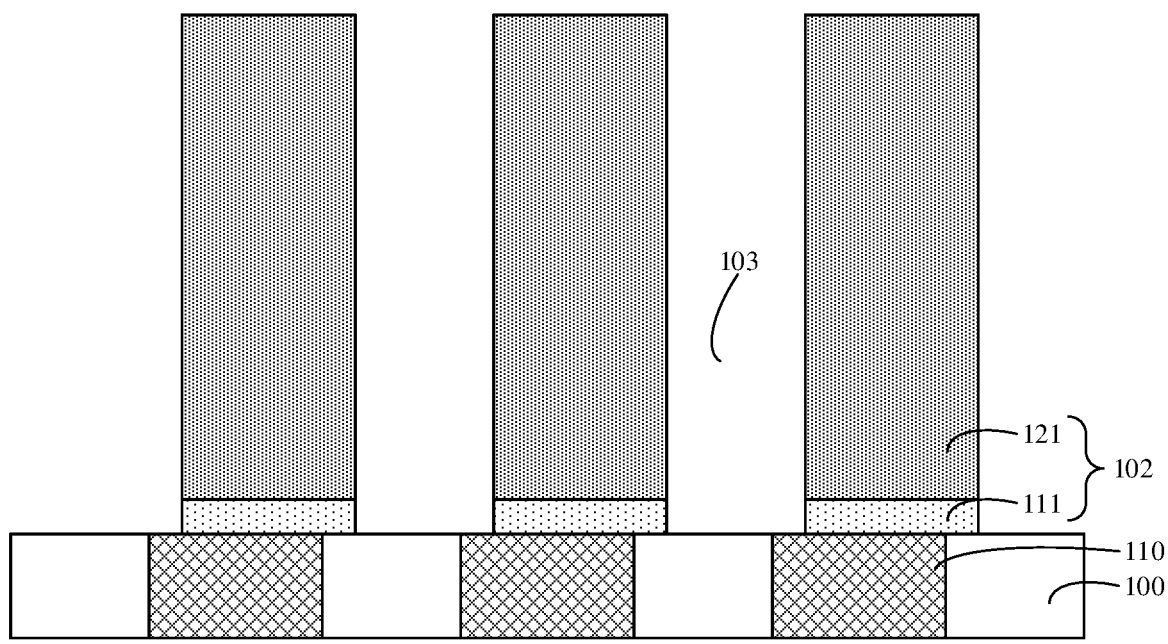

Referring to FIG. 5, the initial supporting layer 101 is etched based on the patterned mask layer 120 to form the capacitor openings 103.

Figure 6:
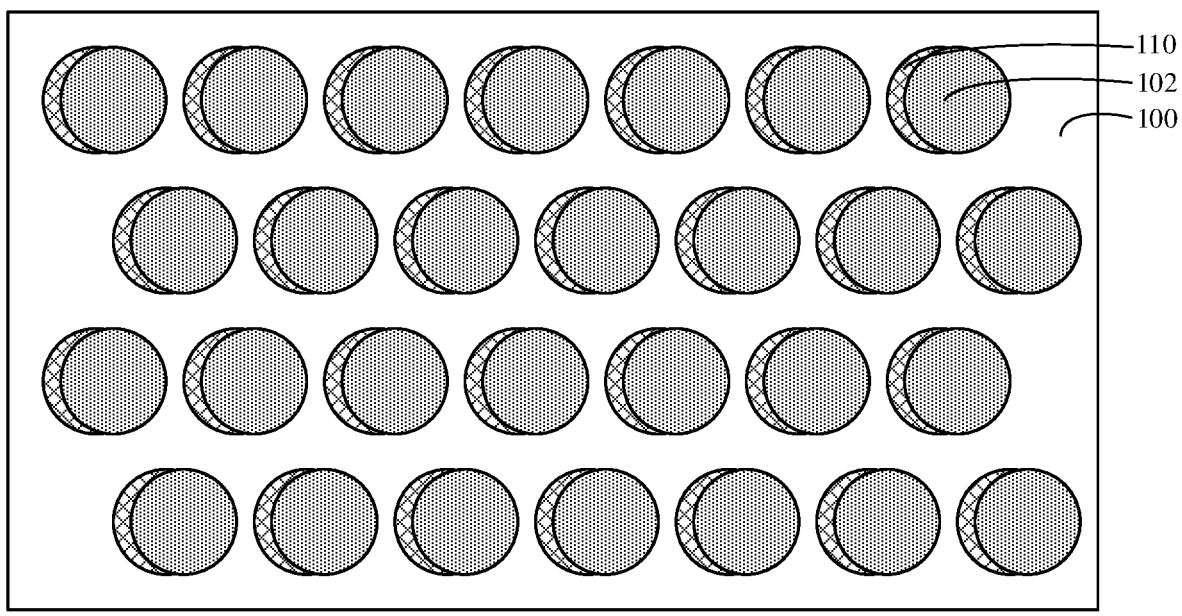

In the embodiment, the capacitor openings 103 at least expose part of a top surface of each discrete conducting layer 110. A morphological distribution of the capacitor openings 103 and the tops of the conducting layers 110 is shown in FIG. 6. The remaining initial supporting layer 101, after the capacitor openings 103 are etched, forms the initial supporting structures 102. That is, in the embodiment, an initial supporting structure 102 includes the bottom supporting layer 111 and the filling layer 121 that are formed by sequential stacking.

After the capacitor openings 103 are formed by etching, the following operation is further included: the photoresist layer 130 and the mask layer 120 are sequentially removed. Specifically, the photoresist layer 130 is removed by a first dry cleaning process. A mixed gas of ammonia, nitrogen, and hydrogen is adopted for the first dry cleaning process. The mixed gas reacts with the photoresist layer 130 to generate a first solid. Then, the first solid is evaporated in a high-temperature evaporation manner to complete removal of the photoresist layer 130. It should be noted that, in the embodiment, when the mixed gas of ammonia, nitrogen, and hydrogen reacts with the photoresist layer 130 to generate the first solid, since the mixed gas is oxygen-free, and the initial supporting structure 102 is prevented from contacting with the air, natural oxidation of a sidewall of the initial supporting structure 102 is prevented when removing the photoresist layer 130. After the photoresist layer 130 is removed, the mask layer 120 is removed by a first wet cleaning process. A mixed solution of 49% HF and 1:1:60 APM ($H_2O_2$:$NH_4OH$:$H_2O$=1:1:60) is adopted for the first wet cleaning process. The mixed solution reacts with the mask layer 120 to remove the mask layer 120. It should be noted that, in the embodiment, when the mixed solution of 49% HF and 1:1:60 APM reacts with the mask layer 120 to remove the mask layer 120, since the mixed solution contains $NH_4OH$, which is ionized and generate $OH^-$, and particulates on the sidewalls of the initial supporting structures 102 can be removed by utilizing the repulsion of a negative charge of $OH^-$ and the oxidation property of $H_2O_2$.

Figure 7:
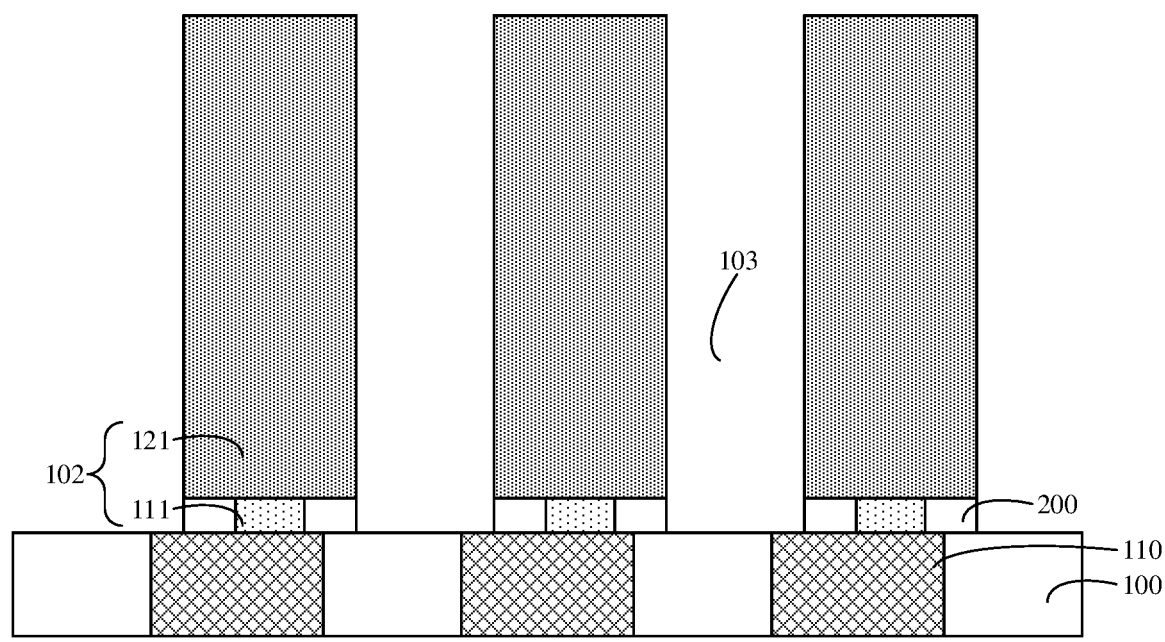

Referring to FIG. 7, the bottom supporting layer 111 of a partial width is laterally etched to form a conducting opening 200.

The bottom supporting layer 111 of the partial width is selectively laterally etched. Specifically, a material with etching selectivity is adopted, so that an etching rate of the bottom supporting layer 111 is higher than an etching rate of the filling layer 121.

In the embodiment, a width of the conducting opening 200 is less than or equal to 1/3 of a width of the bottom supporting layer 111 in a direction parallel to a top surface of the semiconductor substrate 100. It is ensured that the remaining bottom supporting layer 111 may still support the initial supporting structure 102 to prevent collapse of the initial supporting structure 102.

It is to be noted that, in the embodiment, the initial supporting structures 102 are arranged to be cylindrical, namely the formed bottom conducting layers 201 are annular structures of the lower portion of the initial supporting structure 102. A shape of the bottom conducting layer is not limited in the embodiment. In another embodiment, the shape of the bottom conducting layer is related to the initial supporting structure.

Referring to FIG. 8, the bottom conducting layer 201 filling the conducting opening 200 is formed, and the bottom conducting layer 201 and the remaining initial supporting structure 102 form the supporting structure 203. In the embodiment, the bottom conducting layer 201 is formed by back-etching, and a lower electrode 104 electrically connected with the bottom conducting layer 201 is subsequently formed to enlarge a contact area of the lower electrode 104 and the conducting layer 110, thereby reducing contact resistance between the lower electrode 104 and the conducting layer 110.

The bottom conducting layer 201 may be formed by one conducting material or by multiple conducting materials, for example, doped polysilicon, titanium, titanium nitride, tungsten and a composite of tungsten. In the embodiment, a titanium nitride material is adopted for the bottom conducting layer 201.

Specifically, a bottom conducting film (not shown in the figure) filling the conducting openings 200 and the capacitor openings 103 of a partial height is formed, the level of a top surface of the bottom conducting film (not shown in the figure) is higher than the level of a top surface of the bottom supporting layer 111. Then, the bottom conducting film (not shown in the figure) exposed from the capacitor openings 103 is etched away to form the bottom conducting layer 201.

Figure 13:
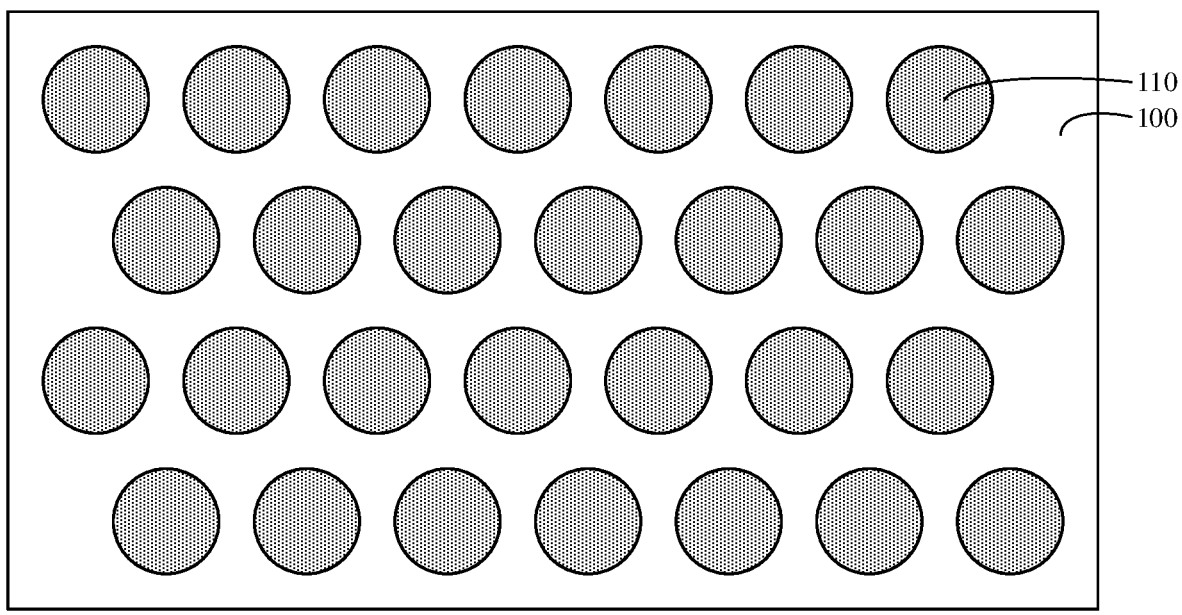

It is to be noted that, in another embodiment, referring to FIG. 9 to FIG. 12, the initial supporting layer 101 is etched based on the patterned mask layer 120 to form the capacitor openings 103, and the capacitor openings 103 do not expose the top surfaces of the conducting layers 110. A morphological distribution of the capacitor openings and the tops of the conducting layers 110 is shown in FIG. 13.

Referring to FIG. 14 to FIG. 18, a capacitor structure 107 is formed based on the supporting structure 203.

Figure 14:
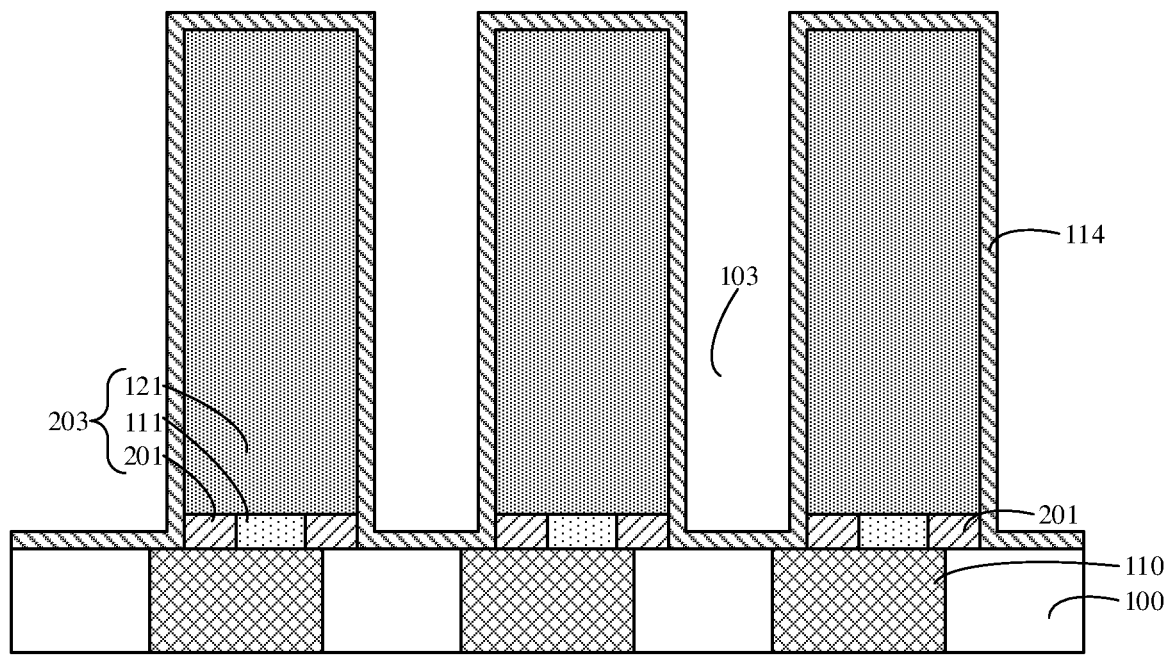
Figure 15:
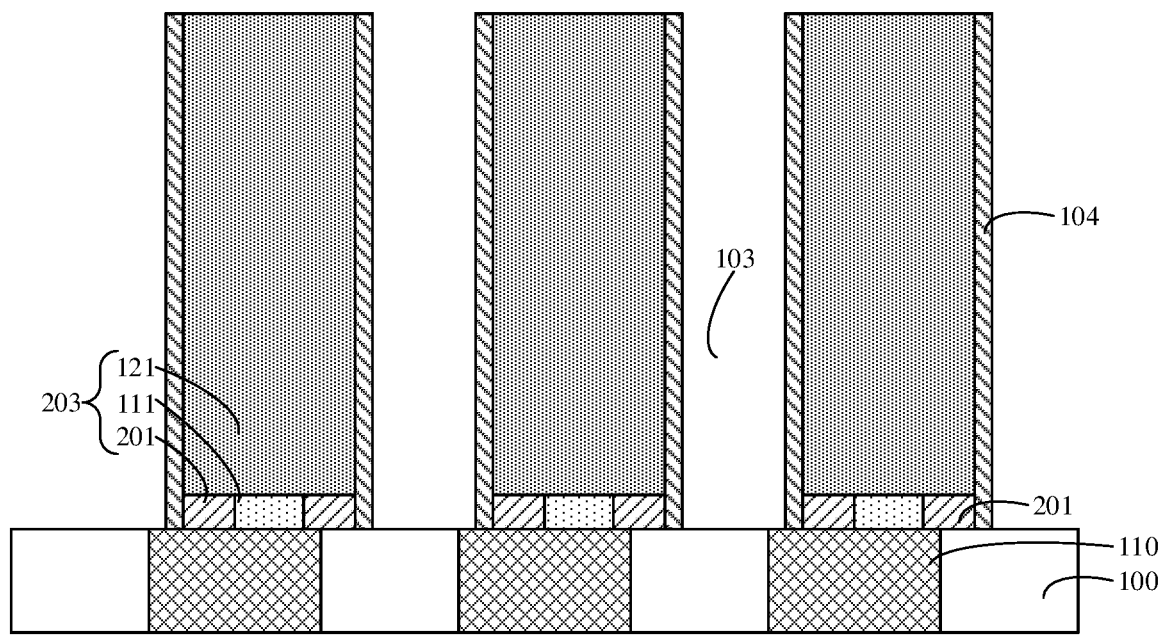

Specifically, referring to FIG. 14 to FIG. 15, a lower electrode 104 is formed on the sidewall of the supporting structure 203. The lower electrode 104 is electrically connected with the bottom conducting layer 201 and the conducting layer 110.

The lower electrode 104 may be formed by one conducting material or by multiple conducting materials, for example, doped polysilicon, titanium, titanium nitride, tungsten and a composite of tungsten. In the embodiment, a titanium nitride material is adopted for the lower electrode 104.

Referring to FIG. 14, a top conducting layer 114 is formed at the top and sidewall of the supporting structure 203 and the bottom of the capacitor opening 103.

Specifically, the top conducting layer 114 is formed by using an atomic layer deposition process or a chemical vapor deposition method. In the embodiment, the top conducting layer 114 is formed by the atomic layer deposition process, and the top conducting layer 114 formed by the atomic layer deposition process is good in coverage. In another embodiment, for example, the top conducting layer may be formed by performing chemical vapor deposition at 500° C. or 600° C. It is to be noted that the above exemplary description of a specific temperature parameter of chemical vapor deposition is only for ease of understanding of those skilled in the art and not intended to form limits to the solution. In practical applications, all parameters in the abovementioned range shall fall within the scope of protection of the disclosure.

Referring to FIG. 15, the top conducting layer 114 on the top of the supporting structure 203 and the bottom of the capacitor opening 103 is removed to form the lower electrode 104 on the sidewall of the supporting structure 203.

Specifically, a process for removing the top conducting layer 114 on the top of the supporting structure 203 includes chemical mechanical polishing. The chemical mechanical polishing for removing the top conducting layer 114 of the supporting structure is simple in flow and low in cost, and the manufacturing efficiency of the capacitor structure may be improved effectively. It is to be noted that, in another embodiment, the top conducting layer may also be flattened by etching.

It is to be noted that, in the embodiment, the bottom conducting layer 201 and the lower electrode 104 are stepwise formed, namely the bottom conducting layer 201 is formed at first, and then the lower electrode 104 is formed. In another embodiment, the bottom conducting layer 201 and the lower electrode 104 may be formed in a one-step forming process, and in such case, the formed lower electrode 104 and bottom conducting layer 201 form an integrated structure, so that the contact resistance between the lower electrode 104 and the bottom conducting layer 201 may further be reduced.

Figure 16:
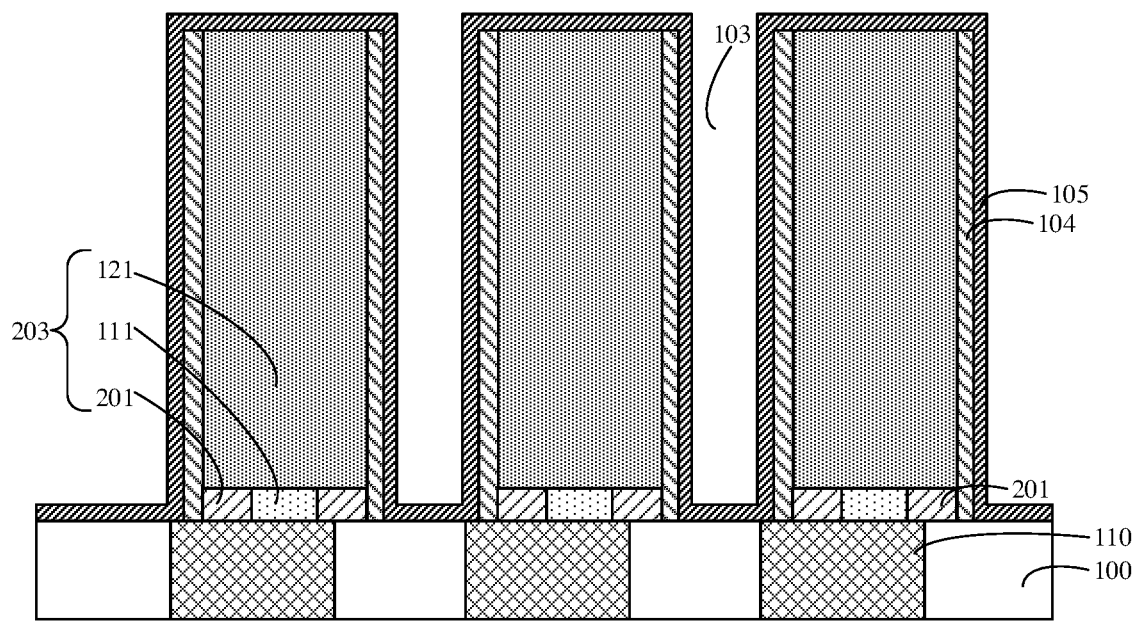

Referring to FIG. 16, a capacitor dielectric layer 105 covering the tops of the supporting structures 203, the sidewalls of the lower electrodes 104, and the bottoms of the capacitor opening s103 is formed.

The capacitor dielectric layer 105 is a high-dielectric-constant material, such as the high-dielectric-constant element of Hf, La, Ti, and Zr or an oxide thereof, or a dopant of Si and N may be adopted. Specifically, the capacitor dielectric layer 105 is formed by using the atomic layer deposition process or the chemical vapor deposition method. In the embodiment, the capacitor dielectric layer 105 is formed by the atomic layer deposition process, and the capacitor dielectric layer 105 formed by the atomic layer deposition process is good in coverage. In another embodiment, for example, the capacitor dielectric layer may be formed by performing chemical vapor deposition at 500° C. or 600° C. It is to be noted that the above exemplary description of a specific temperature parameter of chemical vapor deposition is only for ease of understanding of those skilled in the art and not intended to form limits to the solution. In practical applications, all parameters in the abovementioned range shall fall within the scope of protection of the disclosure.

Figure 17:
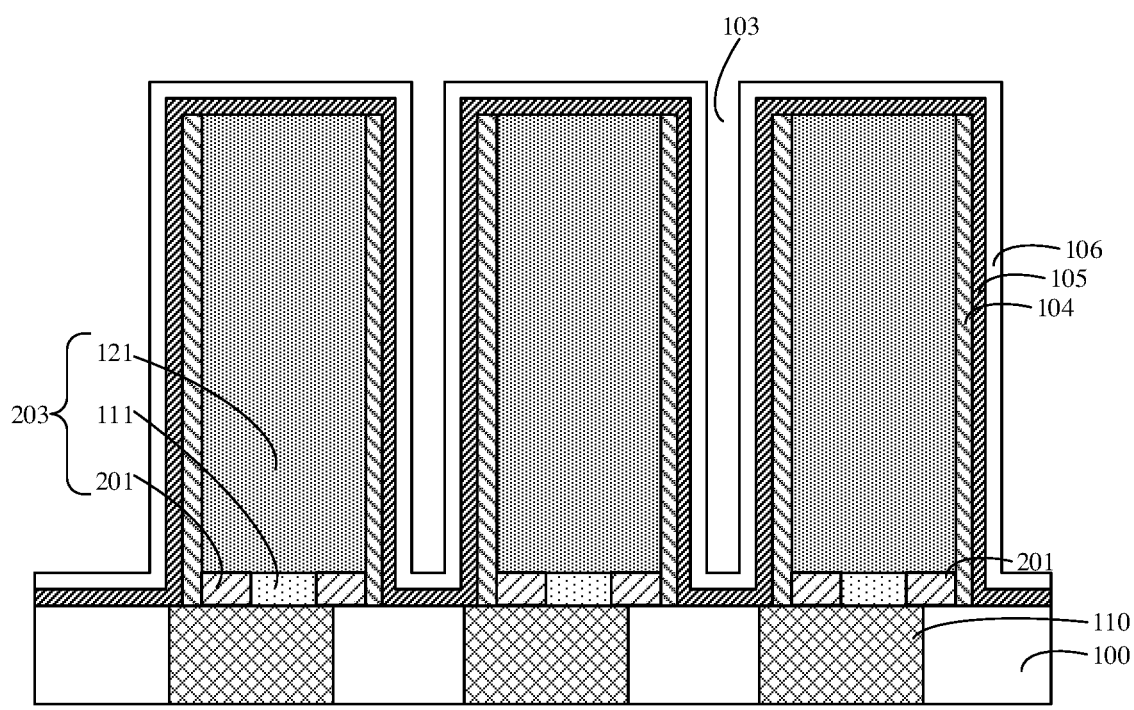
Figure 18:
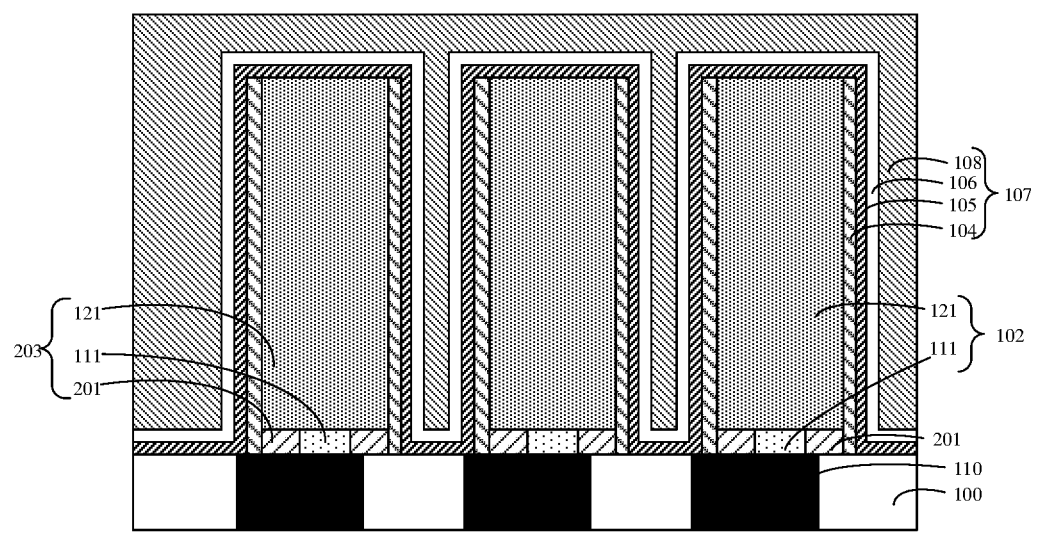

Referring to FIG. 17 to FIG. 18, an upper electrode covering the capacitor dielectric layer 105 is formed. The lower electrode 104, the capacitor dielectric layer 105, and the upper electrode jointly constitute the capacitor structure 107.

Specifically, the operation that the upper electrode covering the capacitor dielectric layer is formed includes the following operations.

Referring to FIG. 17, a first conducting layer 106 covering the capacitor dielectric layer 105 is formed.

The first conducting layer 106 may be a conducting material or formed by multiple conducting materials, for example, doped polysilicon, titanium, titanium nitride, tungsten, and a composite of tungsten. In the embodiment, a titanium nitride material is adopted for the first conducting layer 106.

Specifically, the first conducting layer 106 is formed by using the atomic layer deposition process or the chemical vapor deposition method. In the embodiment, the first conducting layer 106 is formed by the atomic layer deposition process, and the first conducting layer 106 formed by the atomic layer deposition process is good in coverage. In another embodiment, for example, the first conducting layer may be formed by performing chemical vapor deposition at 500° C. or 600° C. It is to be noted that the above exemplary description of a specific temperature parameter of chemical vapor deposition is only for ease of understanding of those skilled in the art and not intended to form limits to the solution. In practical applications, all parameters in the abovementioned range shall fall within the scope of protection of the disclosure.

Referring to FIG. 18, a second conducting layer 108 filling a gap between the first conducting layers 106 is formed. A top surface of the second conducting layer 108 is parallel to a top surface of the first conducting layer 106 on the supporting structure 203, and the level of the top surface of the second conducting layer 108 is higher than the level of the top surface of the first conducting layer 106 on the supporting structure 203.

Specifically, a second conducting film (not shown in the figure) filling the gap between the first conducting layers 106 is formed. The level of a top surface of the second conducting film is higher than the level of the top surface of the first conducting layer 106. A chemical mechanical polishing treatment is performed on the top surface of the second conducting film (not shown in the figure) to form the second conducting layer 108.

The chemical mechanical polishing manner for removing the second conducting layer 108 is simple in flow and low in cost, and the manufacturing efficiency of the semiconductor structure may be improved effectively. It is to be noted that, in another embodiment, the second conducting film may be etched to form the second conducting layer. The gap between the first conducting layer 106 is filled such that the discrete capacitor structures 107 are integrated.

Compared with the means of forming a double-sided capacitor in the related art, by forming stable supporting structure on the semiconductor substrate at first, the embodiments of the disclosure form the capacitor structure of a columnar structure based on the stable supporting structure. Due to the stable supporting structure, a height of a formed columnar capacitor is greatly increased compared with that of a double-sided capacitor, namely the columnar capacitor has a higher aspect ratio. In a process of forming the columnar capacitor, no high-aspect-ratio capacitor hole is required to be formed by etching, so that process operations are simpler, and the cost is reduced. Since no high-aspect-ratio capacitor hole is required to be formed by etching, the stability of the formed capacitor structure is also ensured. In addition, compared with the double-sided capacitor, the columnar capacitor has the advantage that the condition that inner-sided capacitor of the double-sided capacitor is electrically instable is avoided, so that the yield of a semiconductor structure is improved.

The above steps are divided only for clear description. During implementation, the steps may be combined into one step, or some steps may be split into multiple steps, and any solution including the same logical relationship falls within the scope of protection of the disclosure. Adding insignificant modifications to the flow or introducing insignificant designs without changing the core design of the flow falls within the scope of protection of the disclosure.

Another embodiment of the disclosure relates to a method for forming semiconductor structure. Another process for forming the bottom conducting layer that is different from the abovementioned embodiment is provided in this embodiment.

FIG. 19 to FIG. 30 show the flowchart corresponding to each step of the method for forming semiconductor structure according to the embodiment. The method for forming semiconductor structure of the embodiment will be specifically described below.

Referring to FIGS. 19 to 22, discretely arranged supporting structures 302 are formed on a semiconductor substrate 300.

Figure 19:
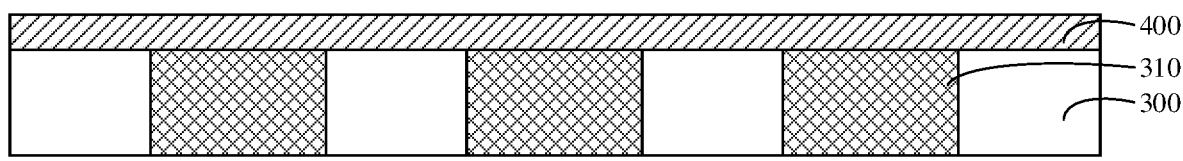
FIG. 19 to FIG. 30 are sectional structure diagrams of a semiconductor structure corresponding to each step of a method for forming semiconductor structure according to another embodiment of the disclosure.
Figure 20:
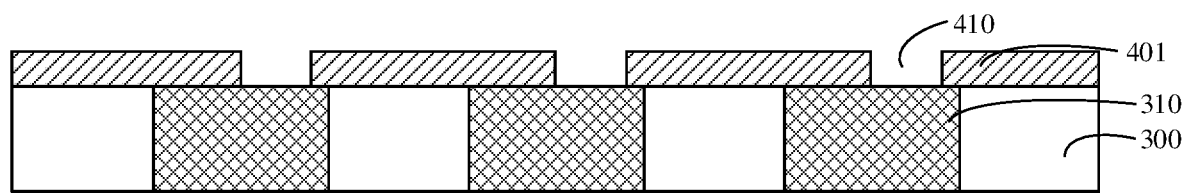

Referring to FIGS. 19 to 20, bottom conducting layers 401 are formed on the semiconductor substrate 300.

Specifically, referring to FIG. 19, a bottom conducting film 400 is formed on the semiconductor substrate 300. The bottom conducting film 400 may be formed by one conducting material or by multiple conducting materials, for example, doped polysilicon, titanium, titanium nitride, tungsten, and a composite of tungsten. In the embodiment, a titanium nitride material is adopted for the bottom conducting film 400.

Referring to FIG. 20, the bottom conducting film 400 is patterned to form through holes 410 that penetrate through the bottom conducting film 400. The remaining bottom conducting film 400 is taken as the bottom conducting layers 401.

Figure 21:
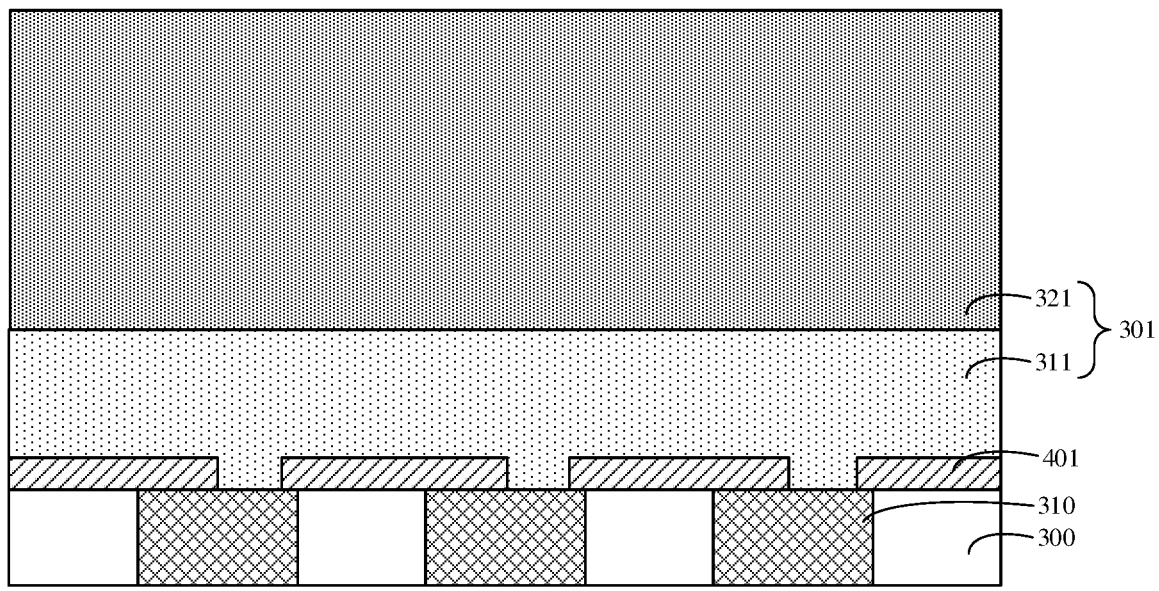

Referring to FIG. 21, a supporting layer 301 is formed on the bottom conducting layer 401, the supporting layer 301 also filling the through holes 410. In the embodiment, the supporting layer 301 includes a bottom supporting layer 311 and filling layer 321 that are formed by sequential stacking. Through a process of sequentially stacking formed supporting layers 301, formation of a supporting layer 301 with a relatively great thickness by a single deposition is avoided, and higher compactness of the formed supporting layer 301 is ensured. The supporting layer 301 is formed by sequentially stacking, so that it is ensured that the supporting structure 302 that is subsequently formed is relatively high, and an aspect ratio of a subsequently formed columnar capacitor is increased. In the embodiment, the bottom supporting layer 111 and the filling layer are formed from different insulating materials. It is to be noted that, in another embodiment, the supporting layer may also be implemented by a stacked structure of three layers or more than three layers, and the stacked structure implemented in such a manner is higher, namely the subsequently formed supporting structure is higher.

Figure 22:
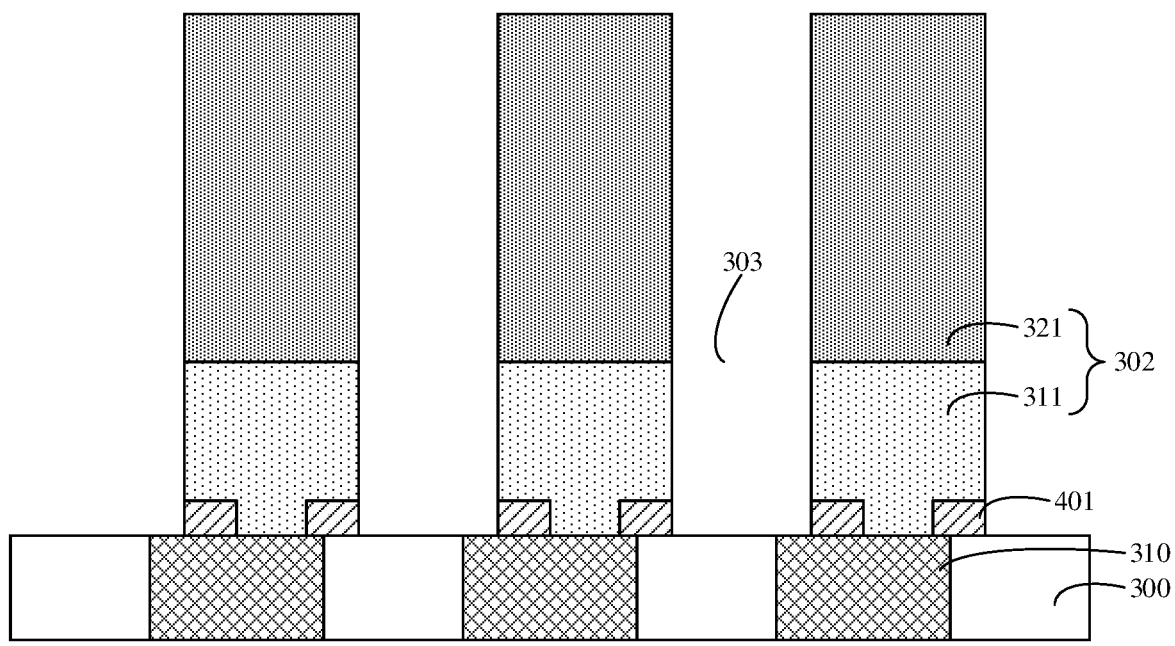
Figure 23:
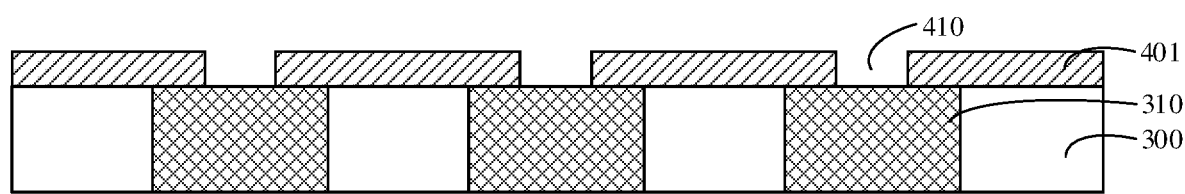
Figure 24:
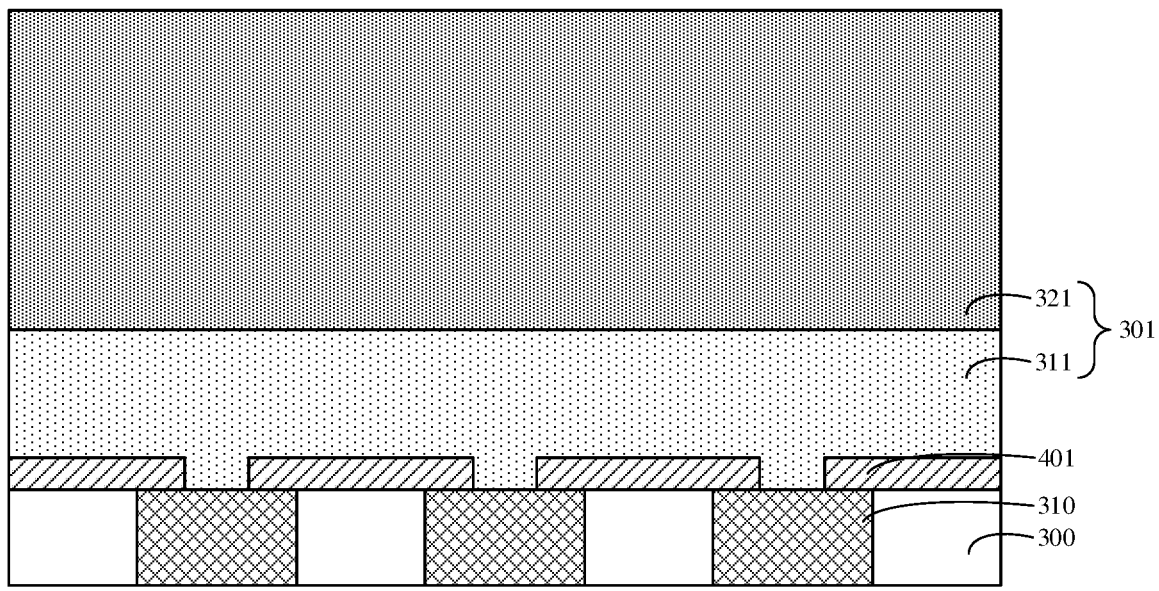
Figure 25:
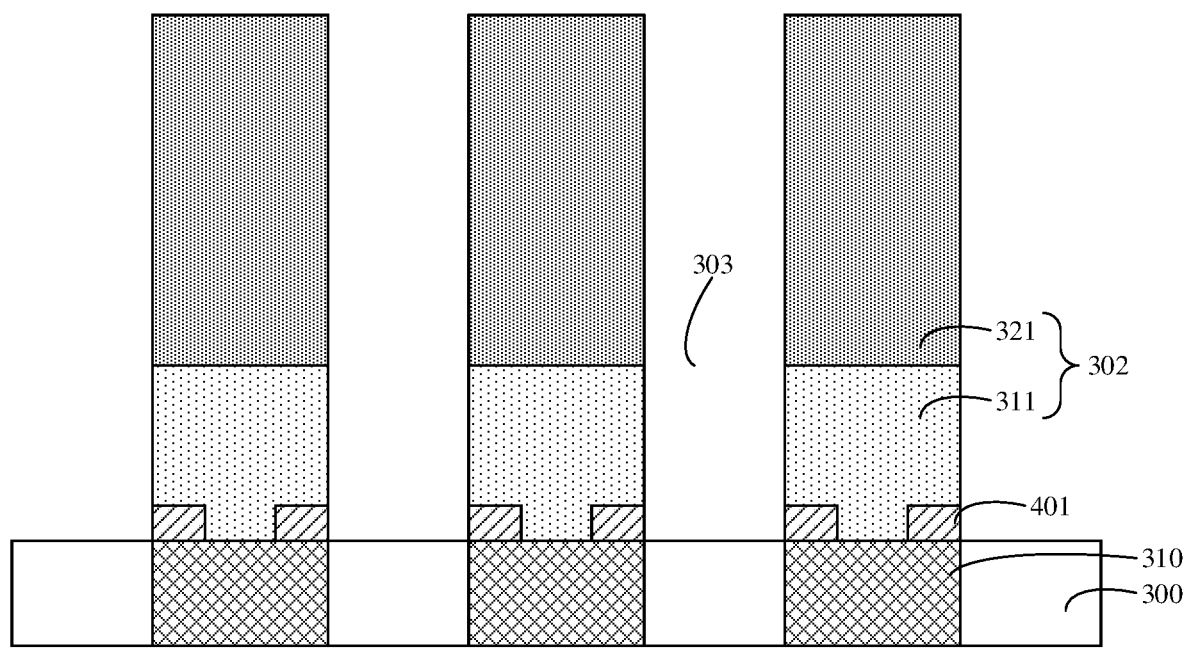

Referring to FIG. 22, the supporting layer 301 is patterned to form multiple discrete capacitor openings 303, and the remaining supporting layer 301 is taken as a supporting structure 302.

Specifically, a mask layer (not shown in the figure) and a patterned photoresist layer (not shown in the figure) are sequentially formed on the supporting layer 301, the mask layer (not shown in the figure) is patterned based on the photoresist layer, the supporting layer 301 and the bottom conducting layer 401 are etched based on the patterned mask layer to form the capacitor openings 303, and the remaining supporting layer 301 and bottom conducting layer 401 are taken as the supporting structure 302.

It is to be noted that, in the embodiment, the capacitor openings 303 at least exposes part of the top surface of each of the discrete conducting layers 310. In another embodiment, referring to FIG. 23 to FIG. 25, the supporting layer 301 is etched based on the patterned mask layer to form the capacitor openings 303, and the capacitor openings 303 do not expose the top surfaces of the conducting layers 310.

Referring to FIG. 26 to FIG. 30, a capacitor structure 307 is formed based on the supporting structure 302.

Figure 26:
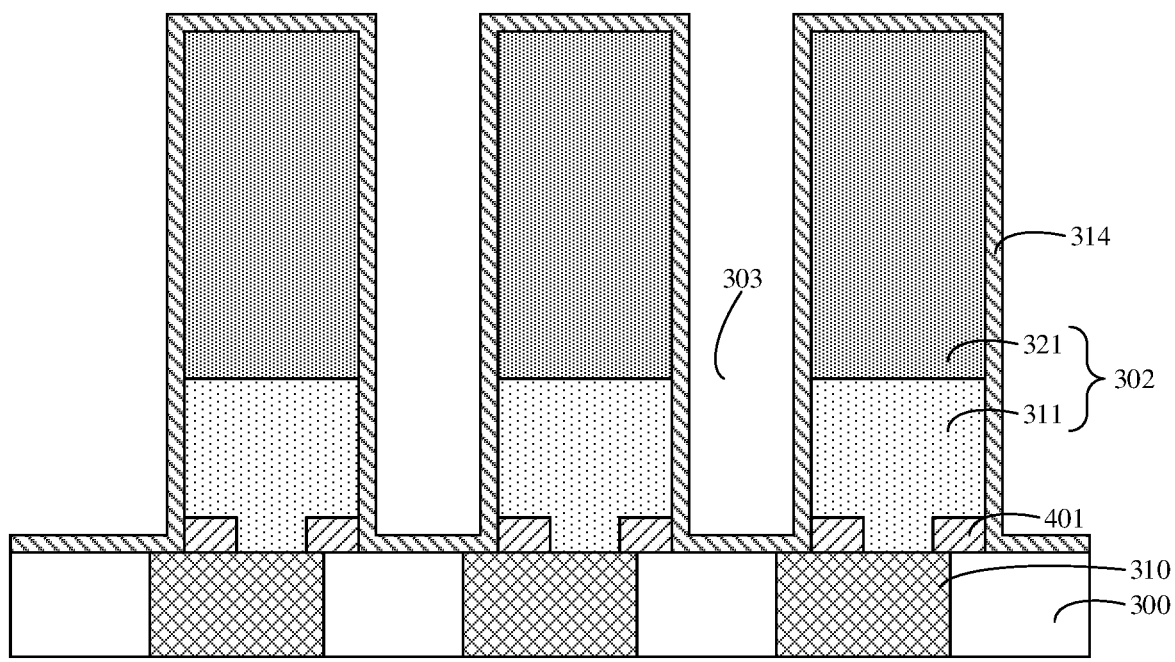
Figure 27:
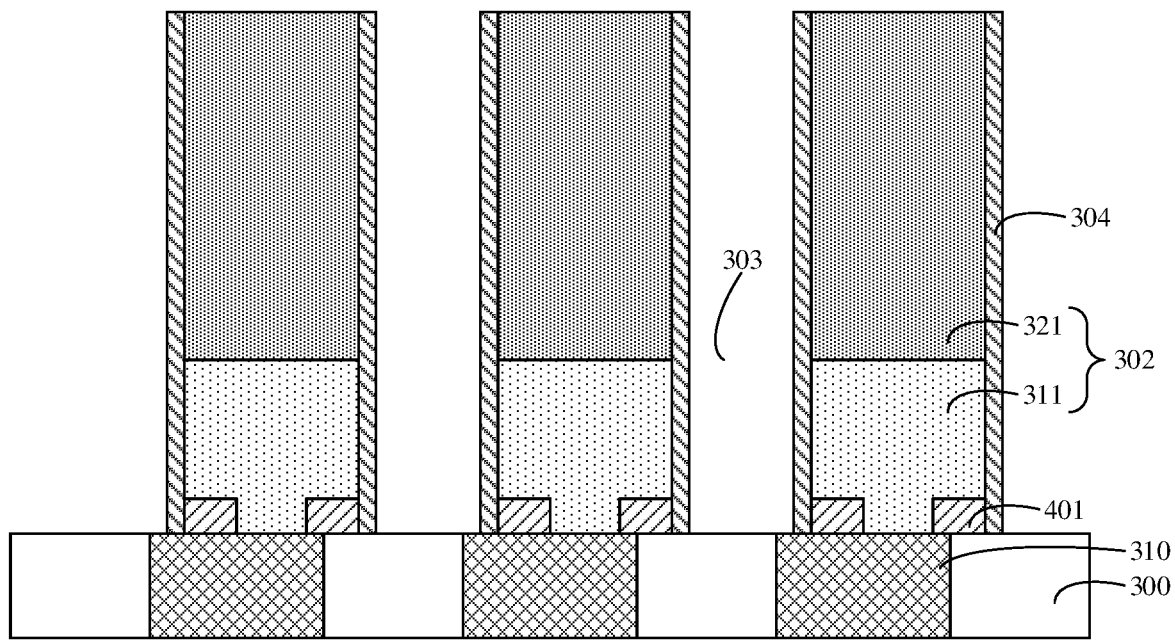

Specifically, referring to FIG. 26 to FIG. 27, a lower electrode 304 is formed on a sidewall of the supporting structure 302. The lower electrode 304 is electrically connected with the bottom conducting layer 401 and the conducting layer 310.

The lower electrode 304 may be a conducting material or formed by multiple conducting materials, for example, doped polysilicon, titanium, titanium nitride, tungsten, and a composite of tungsten. In the embodiment, a titanium nitride material is adopted for the lower electrode 304.

Referring to FIG. 26, a top conducting layer 314 is formed at the top and sidewall of the supporting structure 302 and the bottom of the capacitor opening 303.

Specifically, the top conducting layer 314 is formed by using an atomic layer deposition process or a chemical vapor deposition method. In the embodiment, the top conducting layer 314 is formed by the atomic layer deposition process, and the top conducting layer 314 formed by the atomic layer deposition process is good in coverage. In another embodiment, for example, the top conducting layer may be formed by performing chemical vapor deposition at 500° C. or 600° C. It is to be noted that the above exemplary description of a specific temperature parameter of chemical vapor deposition is only for ease of understanding of those skilled in the art and not intended to form limits to the solution. In practical applications, all parameters in the abovementioned range shall fall within the scope of protection of the disclosure.

Referring to FIG. 27, the top conducting layer 314 on the tops of the supporting structures 302 and the bottoms of the capacitor openings 303 is removed to form the lower electrodes 304 on the sidewalls of the supporting structures 302.

Specifically, a process for removing the top conducting layer 314 on the tops of the supporting structures 302 includes chemical mechanical polishing. The chemical mechanical polishing for removing the top conducting layer 314 of the supporting structure is simple in flow and low in cost, and the manufacturing efficiency of the capacitor structure may be improved effectively. It is to be noted that, in another embodiment, the top conducting layer may also be flattened by etching.

Figure 28:
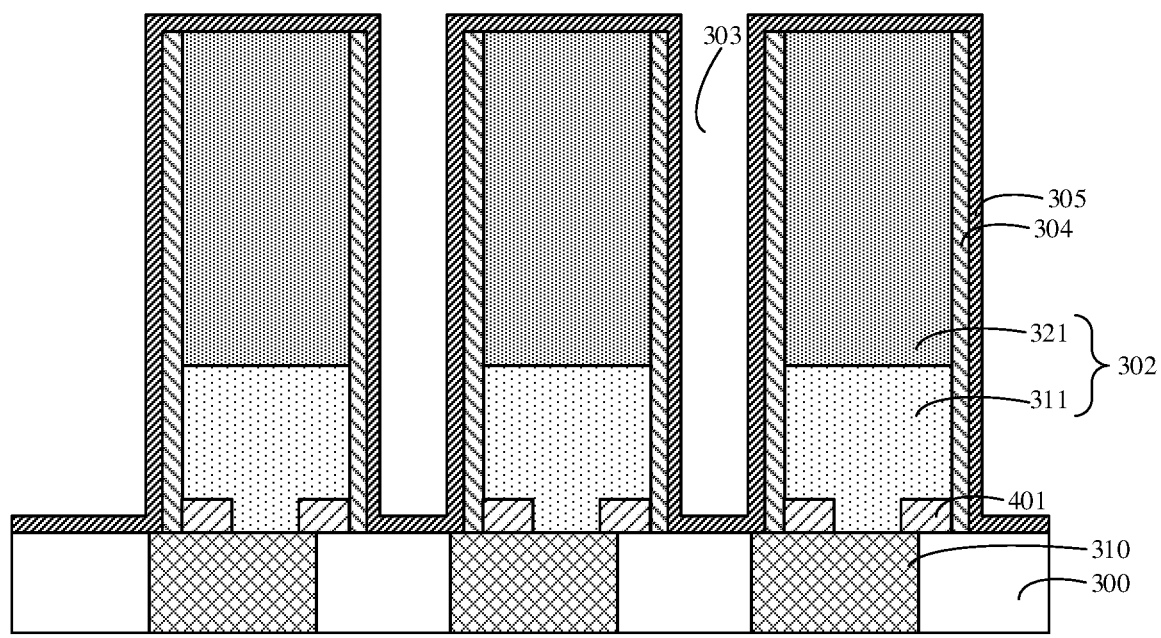

Referring to FIG. 28, a capacitor dielectric layer 305 covering the tops of the supporting structures 302, the sidewalls of the lower electrodes 304, and the bottoms of the capacitor openings 303 is formed.

The capacitor dielectric layer 305 is a high-dielectric-constant material, for example, a high-dielectric-constant element such as Hf, La, Ti, and Zr or an oxide thereof, or a dopant of Si and N may be adopted. Specifically, the capacitor dielectric layer 305 is formed by using the atomic layer deposition process or the chemical vapor deposition method. In the embodiment, the capacitor dielectric layer 305 is formed by the atomic layer deposition process, and the capacitor dielectric layer 305 formed by the atomic layer deposition process is good in coverage. In another embodiment, for example, the capacitor dielectric layer may be formed by performing chemical vapor deposition at 500° C. or 600° C. It is to be noted that the above exemplary description of a specific temperature parameter of chemical vapor deposition is only for ease of understanding of those skilled in the art and not intended to form limits to the solution. In practical applications, all parameters in the abovementioned range shall fall within the scope of protection of the disclosure.

Figure 29:
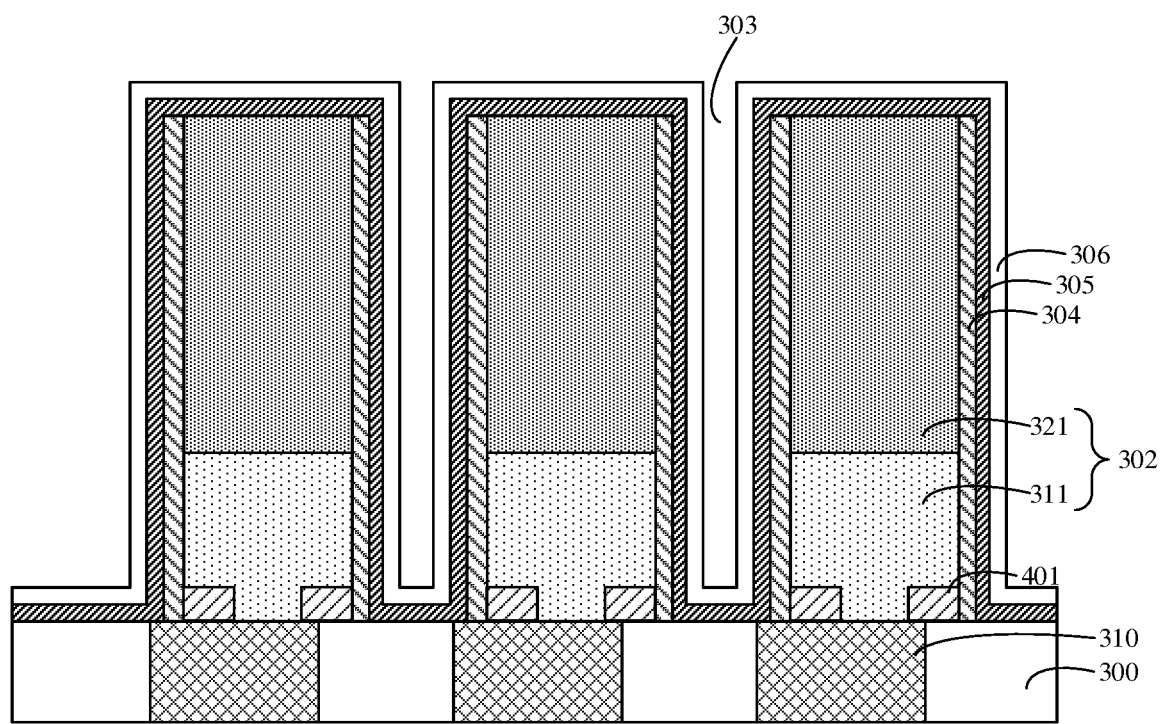
Figure 30:
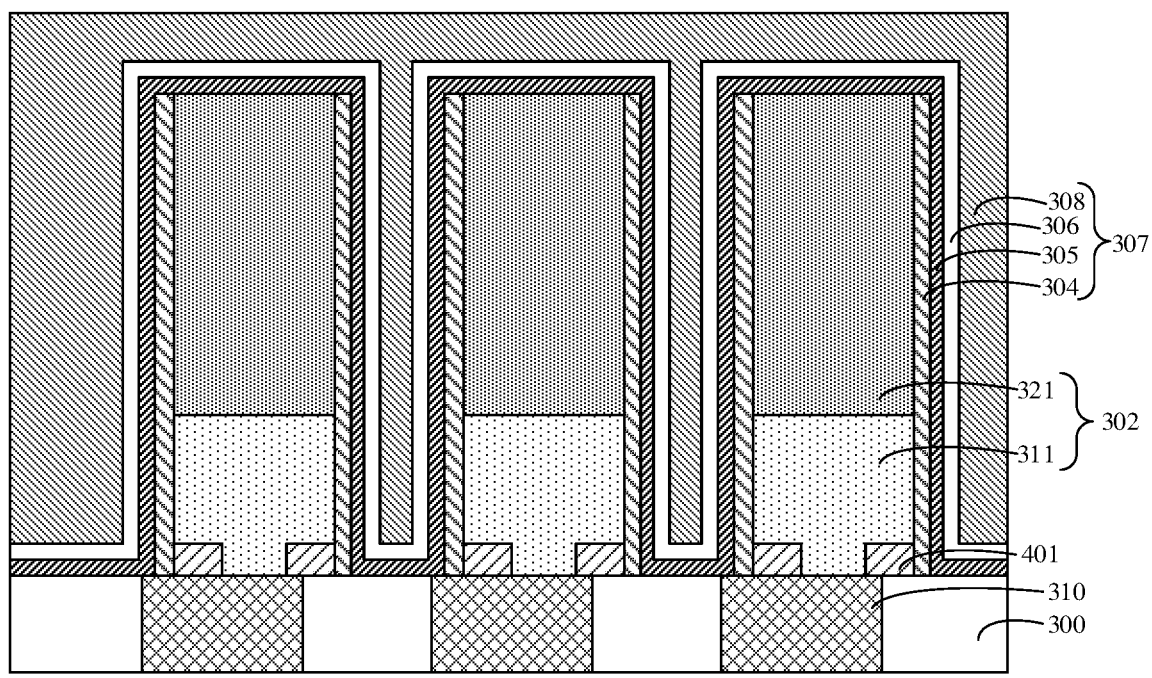

Referring to FIG. 29 to FIG. 30, an upper electrode covering the capacitor dielectric layer 305 is formed. The lower electrode 304, the capacitor dielectric layer 305, and the upper electrode jointly constitute the capacitor structure 307.

Specifically, the operation that the upper electrode covering the capacitor dielectric layer is formed includes the following operations.

Referring to FIG. 29, a first conducting layer 306 covering the capacitor dielectric layer 305 is formed.

The first conducting layer 306 may be a conducting material or formed by multiple conducting materials, for example, doped polysilicon, titanium, titanium nitride, tungsten, and a composite of tungsten. In the embodiment, a titanium nitride material is adopted for the first conducting layer 306.

Specifically, the first conducting layer 306 is formed by using the atomic layer deposition process or the chemical vapor deposition method. In the embodiment, the first conducting layer 306 is formed by the atomic layer deposition process, and the first conducting layer 306 formed by the atomic layer deposition process is good in coverage. In another embodiment, for example, the first conducting layer 306 may be formed by performing chemical vapor deposition at 500° C. or 600° C. It is to be noted that the above exemplary description of a specific temperature parameter of chemical vapor deposition is only for ease of understanding of those skilled in the art and not intended to form limits to the solution. In practical applications, all parameters in the abovementioned range shall fall within the scope of protection of the disclosure.

Referring to FIG. 30, a second conducting layer 308 filling a gap between the first conducting layer 306 is formed. A top surface of the second conducting layer 308 is parallel to the top surface of the first conducting layer 306 on the supporting structures 302, and the level of the top surface of the second conducting layer 308 is higher than the level of the top surface of the first conducting layer 306 on the supporting structure 302.

Specifically, a second conducting film (not shown in the figure) filling the gap between the first conducting layers 306 is formed. The level of a top surface of the second conducting film is higher than the level of the top surface of the first conducting layer 306. A chemical mechanical polishing treatment is performed on the top surface of the second conducting film (not shown in the figure) to form the second conducting layer 308.

The chemical mechanical polishing treatment for removing the second conducting layer 308 is simple in flow and low in cost, and the manufacturing efficiency of the semiconductor structure may be improved effectively. It is to be noted that, in another embodiment, the second conducting film may be etched to form the second conducting layer. The gap between the first conducting layer 306 is filled, such that the discrete capacitor structures 307 are integrated.

Compared with the process of forming a double-sided capacitor in the related art, by forming stable supporting structure on the semiconductor substrate at first, the embodiments of the disclosure form the capacitor structure of a columnar structure based on the stable supporting structure. Due to the stable supporting structure, a height of a formed columnar capacitor is greatly increased compared with that of a double-sided capacitor, namely the columnar capacitor has a higher aspect ratio. In a process of forming the columnar capacitor, no high-aspect-ratio capacitor hole is required to be formed by etching, so that process operations are simpler, and the cost is reduced. Since no high-aspect-ratio capacitor hole is required to be formed by etching, the stability of the formed capacitor structure is also ensured. In addition, compared with the double-sided capacitor, the columnar capacitor has the advantage that the condition that inner-sided capacitor of the double-sided capacitor is electrically instable is avoided, so that the yield of a semiconductor structure is improved.

In addition, for highlighting innovative parts of the disclosure, units related not so closely to the technical problem to be solved in the disclosure are not introduced in the embodiment, but this does not mean that there are no other structures in the embodiment.

The abovementioned embodiment corresponds to the present embodiment, so that the present embodiment can be matched with the abovementioned embodiment for implementation. The related technical details mentioned in the abovementioned embodiment are still effective in the present embodiment, and the technical effects that may be achieved in the abovementioned embodiment may also be achieved in the present embodiment. For reducing repetitions, elaborations are omitted herein. Correspondingly, related technical details mentioned in the present embodiment may also be applied to the abovementioned embodiment.

The above steps are divided only for clear description. During implementation, the steps may be combined into one step, or some steps may be split into multiple steps, and any solution including the same logical relationship falls within the scope of protection of the disclosure. Adding insignificant modifications to the flow or introducing insignificant designs without changing the core design of the flow falls within the scope of protection of the disclosure.

Another embodiment of the disclosure relates to a semiconductor structure. Referring to FIG. 18, the semiconductor structure provided in the embodiment will be described below in detail in combination with the drawing. The contents that are same as or corresponding to the abovementioned embodiments will not be elaborated below.

The semiconductor structure includes: a semiconductor substrate 100, which at least includes discrete conducting layers 110; multiple discrete supporting structures 203 located on the semiconductor substrate 100, in which a bottom conducting layer 201 is included in a lower portion of the supporting structure 203, and the bottom conducting layer 201 is electrically connected with the conducting layer 110; and capacitor structures 107 supported by the supporting structures 203. The capacitor structure 107 includes a lower electrode 104 located on a sidewall of the supporting structure 203 and electrically connected with the conducting layer 110; a capacitor dielectric layer 105 located on a top of the supporting structure 203, a sidewall of the lower electrode 104, and a bottom of a gap between the supporting structures 203; and an upper electrode, located on the capacitor dielectric layer 105.

An arrangement manner of the discrete conducting layers 110 in the semiconductor substrate 100 is shown in FIG. 2. The conducting layers 112 are landing pads in a DRAM structure. The conducting layers 110 are arranged hexagonally and configured to electrically connect array transistors of the DRAM.

The supporting structure 203 provided in the embodiment may be implemented by a stacked structure, and the supporting structure 203 formed by the stacked structure is higher, namely the subsequently formed capacitor 107 has a higher aspect ratio.

In the embodiment, the gap between the supporting structures 203 at least exposes part of a top surface of each discrete conducting layer 110. The lower electrode 104 is configured to connect the exposed top surface of the discrete conducting layer 110.

In an example, the lower electrode 104 and the bottom conducting layer 201 form an integrated structure. The lower electrode and the bottom conducting layer are integrally formed to further reduce contact resistance of the lower electrode.

In the embodiment, a width of a conducting opening 200 is less than 1/3 of a width of the bottom supporting layer 111 in a direction parallel to a top surface of the semiconductor substrate 100. It is ensured that a left bottom supporting layer 111 may still support the initial supporting structure 102 to prevent collapse of the initial supporting structure 102.

The capacitor structure 107 includes: the lower electrode 104, located on the sidewall of the supporting structure 102 and electrically connected with the conducting layer 110; the capacitor dielectric layer 105, located on the top of the supporting structure 102, the sidewall of the lower electrode 104, and the bottom of the gap between the supporting structures 102; and the upper electrode, located on the capacitor dielectric layer 105.

The lower electrode 104 may be a conducting layer or formed by multiple conducting materials, for example, doped polysilicon, titanium, titanium nitride, tungsten, and a composite of tungsten. In the embodiment, a titanium nitride material is adopted for the lower electrode 104. The capacitor dielectric layer 105 is a high-dielectric-constant material, for example, a high-dielectric-constant element such as Hf, La, Ti, and Zr or an oxide thereof, or a dopant of Si and N may be adopted.

The upper electrode includes a first conducting layer 106 and a second conducting layer 108. The first conducting layer 106 covers the capacitor dielectric layer 105. The first conducting layer 106 may be a conducting layer or formed by multiple conducting materials, for example, doped polysilicon, titanium, titanium nitride, tungsten, and a composite of tungsten. In the embodiment, a titanium nitride material is adopted for the first conducting layer 106. The second conducting layer 108 fills a gap between the first conducting layers 106. A top surface of the second conducting layer 108 is parallel to a top surface of the first conducting layer 106 on the supporting structure 203, and the level of the top surface of the second conducting layer 108 is higher than the level of the top surface of the first conducting layer 106 on the supporting structure 203.

Compared with a capacitor structure of a double-sided capacitor, a capacitor structure of a columnar capacitor is formed based on a stable supporting structure. Due to the stable supporting structure, a height of the columnar capacitor is greatly increased compared with that of the double-sided capacitor, namely the columnar capacitor has a higher aspect ratio. Process operations for forming the columnar capacitor are simpler, and the cost is reduced. Since no high-aspect-ratio capacitor hole is required to be formed by etching, the stability of the capacitor structure of the formed columnar capacitor is also ensured. In addition, compared with the double-sided capacitor, the columnar capacitor has the advantage that the condition that inner-sided capacitor of the double-sided capacitor is electrically instable is avoided, so that the yield of the semiconductor structure is improved.

For highlighting innovative parts of the disclosure, units related not so closely to the technical problem to be solved in the disclosure are not introduced in the embodiment, but this does not mean that there are no other structures in the embodiment.

The abovementioned embodiments correspond to the present embodiment, so that the present embodiment can be matched with the abovementioned embodiments for implementation. The related technical details mentioned in the abovementioned embodiment are still effective in the present embodiment, and the technical effects that may be achieved in the abovementioned embodiment may also be achieved in the present embodiment. For reducing repetitions, elaborations are omitted herein. Correspondingly, related technical details mentioned in the present embodiment may also be applied to the abovementioned embodiments.

Those of ordinary skill in the art can understand that each embodiment is a specific embodiment implementing the disclosure, and in practical applications, various variations about the form and details can be made thereto without departing from the spirit and scope of the disclosure.

The invention claimed is:
1. A method for forming semiconductor structure, comprising the following steps:
providing a semiconductor substrate, which at least comprises discrete conducting layers in the semiconductor substrate;
forming discretely arranged supporting structures on the semiconductor substrate, lower portions of the supporting structures comprising bottom conducting layers, wherein a width of each one of the bottom conducting layers is less than or equal to ⅓ of a width of each one of the multiple supporting structures in a direction parallel to a top surface of the semiconductor substrate, capacitor openings being comprised between the supporting structures, and the bottom conducting layers being electrically connected with the conducting layers;

forming lower electrodes only on sidewalls of the supporting structures, the lower electrodes being electrically connected with the bottom conducting layers;

forming a capacitor dielectric layer covering tops of the supporting structures, sidewalls of the lower electrodes, and bottoms of the capacitor openings; and forming an upper electrode covering the capacitor dielectric layer, to form a capacitor structure.

2. The method for forming semiconductor structure of claim 1, wherein the step of forming the discretely arranged supporting structures on the semiconductor substrate comprises:

forming the bottom conducting layers on the semiconductor substrate;

forming a supporting layer on the bottom conducting layers; and patterning the supporting layer and the bottom conducting layers to form the capacitor opening, and form the supporting structures by the remaining supporting layer and bottom conducting layers.

3. The method for forming semiconductor structure of claim 2, wherein the step of forming the bottom conducting layers on the semiconductor substrate and forming the supporting layers on the bottom conducting layers comprises:

forming a bottom conducting film on the semiconductor substrate;

patterning the bottom conducting film to form through holes that penetrate through the bottom conducting film, and taking the remaining bottom conducting film as the bottom conducting layer; and forming the supporting layer on the bottom conducting layer, and the supporting layer also filling the through holes.

4. The method for forming semiconductor structure of claim 2, wherein patterning the supporting layer to form multiple discrete capacitor openings comprises:

sequentially forming a mask layer and a patterned photoresist layer on the supporting layer;

patterning the mask layer based on the photoresist layer; and etching the supporting layer and the bottom conducting layer based on the patterned mask layer to form the capacitor openings.

5. The method for forming semiconductor structure of claim 2, wherein a capacitor opening at least exposes part of a top surface of each of the discrete conducting layers.

6. The method for forming semiconductor structure of claim 2, wherein the supporting layer is consisted of a bottom supporting layer and a filling layer that are sequentially stacked.

7. The method for forming semiconductor structure of claim 1, wherein the step of forming the discretely arranged supporting structures on the semiconductor substrate comprises:

forming discretely arranged initial supporting structures on the semiconductor substrate, wherein each one of the initial supporting structures comprises a bottom supporting layer and a filling layer that are sequential stacked;

laterally etching the bottom supporting layer of a partial width to form a conducting opening; and forming the bottom conducting layer filling the conducting opening, the supporting structures being formed, by the bottom conducting layer and remaining initial supporting structures.

8. The method for forming semiconductor structure of claim 7, wherein a width of the conducting opening is less than or equal to ⅓ of a width of the bottom supporting layer in a direction parallel to a top surface of the semiconductor substrate.

9. The method for forming semiconductor structure of claim 7, wherein the step of forming the bottom conducting layer filling the conducting opening comprises:

forming a bottom conducting film filling the conducting opening and a part of height of the capacitor opening, and a level of a top surface of the bottom conducting film is higher than a level of a top surface of the bottom supporting layer; and etching away the bottom conducting film exposed from the capacitor opening to form the bottom conducting layer.

10. The method for forming semiconductor structure of claim 1, wherein the step of forming the lower electrodes electrically connected with the conducting layers on the sidewalls of the supporting structures comprises:

forming a top conducting layer at the tops and sidewalls of the supporting structures and the bottoms of the capacitor openings; and removing the top conducting layer on the tops of the supporting structures and the bottoms of the capacitor openings to form the lower electrodes on the sidewalls of the supporting structures.

11. The method for forming semiconductor structure of claim 10, wherein a means for removing the top conducting layer on the tops of the supporting structures comprises chemical mechanical polishing.

12. The method for forming semiconductor structure of claim 1, wherein the step of forming the upper electrode covering the capacitor dielectric layer comprises:

forming a first conducting layer covering the capacitor dielectric layer; and forming a second conducting layer filling a gap between the first conducting layer, a top surface of the second conducting layer being parallel to a top surface of the first conducting layer on the supporting structures, and a level of the top surface of the second conducting layer is higher than a level of the top surface of the first conducting layer on the supporting structures.

13. The method for forming semiconductor structure of claim 12, wherein the step of forming the second conducting layer filling the gap between the first conducting layer comprises:

forming a second conducting film filling the gap between the first conducting layer, and the level of the top surface of the second conducting film is higher than the level of the top surface of the first conducting layer on the supporting structures; and performing a chemical mechanical polishing treatment on the top surface of the second conducting film to form the second conducting layer.

14. A semiconductor structure, comprising:

a semiconductor substrate, wherein the semiconductor substrate at least comprises discrete conducting layers;

multiple discrete supporting structures located on the semiconductor substrate, wherein a lower portion of each one of the multiple discrete supporting structures at least comprises a bottom conducting layer, and the bottom conducting layer is electrically connected with each one of the discrete conducting layers; wherein a width of the bottom conducting layer is less than or equal to ⅓ of a width of each one of the multiple discrete supporting structures in a direction parallel to a top surface of the semiconductor substrate; and capacitor structures supported by each one of the multiple discrete supporting structures, wherein each one of the capacitor structures comprises:

a lower electrode, located only on a sidewall of each one of the multiple discrete supporting structures and electrically connected with the bottom conducting layer;

a capacitor dielectric layer, located on a top of each one of the multiple discrete supporting structures, a sidewall of the lower electrode, and a bottom of a gap between each one of the multiple discrete supporting structures; and an upper electrode, located on the capacitor dielectric layer.

15. The semiconductor structure of claim 14, wherein the gap between each one of the multiple discrete supporting structures at least exposes a part of a top surface of each of the discrete conducting layers.

16. The semiconductor structure of claim 14, wherein the lower electrode and the bottom conducting layer are an integrated structure.

* * * * *